(12) United States Patent
Derner et al.

(10) Patent No.: US 10,366,738 B2
(45) Date of Patent: Jul. 30, 2019

(54) INTEGRATED MEMORY ASSEMBLIES COMPRISING MULTIPLE MEMORY ARRAY DECKS

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 15/797,462

(22) Filed: Oct. 30, 2017

(65) Prior Publication Data

US 2018/0218765 A1    Aug. 2, 2018

Related U.S. Application Data

(60) Provisional application No. 62/452,193, filed on Jan. 30, 2017.

(51) Int. Cl.
*H01L 27/108* (2006.01)
*G11C 11/4091* (2006.01)
(Continued)

(52) U.S. Cl.
CPC ........ *G11C 11/4085* (2013.01); *G11C 11/404* (2013.01); *G11C 11/405* (2013.01); *G11C 11/4097* (2013.01); *H01L 23/528* (2013.01); *H01L 27/0207* (2013.01); *H01L 27/108* (2013.01); *H01L 27/10805* (2013.01);
(Continued)

(58) Field of Classification Search
CPC ............ G11C 11/4085; G11C 11/4087; G11C 11/4091; G11C 11/4094; G11C 11/4096; G11C 11/4097; H01L 27/108; H01L 27/10805; H01L 27/10814; H01L 27/10817
See application file for complete search history.

(56) References Cited

U.S. PATENT DOCUMENTS

| | | | |
|---|---|---|---|
| 8,964,474 B2* | 2/2015 | Morooka | G11C 16/06 365/185.17 |
| 9,679,650 B1* | 6/2017 | Sakui | G11C 16/08 |

(Continued)

FOREIGN PATENT DOCUMENTS

WO          WO          2/2017
PCT/US2017/059022

*Primary Examiner* — Allison Bernstein
(74) *Attorney, Agent, or Firm* — Wells St. John P.S.

(57) ABSTRACT

Some embodiments include an integrated memory assembly having a first memory array deck over a second memory array deck. A first series of conductive lines extends across the first memory array deck, and a second series of conductive lines extends across the second memory array deck. A first conductive line of the first series and a first conductive line of the second series are coupled with a first component through a first conductive path. A second conductive line of the first series and a second conductive line of the second series are coupled with a second component through a second conductive path. The first and second conductive lines of the first series extend through first isolation circuitry to the first and second conductive paths, respectively; and the first and second conductive lines of the second series extend through second isolation circuitry to the first and second conductive paths, respectively.

22 Claims, 24 Drawing Sheets

(51) Int. Cl.
  *G11C 11/4094*  (2006.01)
  *G11C 11/4097*  (2006.01)
  *G11C 11/408*   (2006.01)
  *G11C 11/404*   (2006.01)
  *G11C 11/405*   (2006.01)
  *H01L 23/528*   (2006.01)
  *H01L 27/02*    (2006.01)
  *H01L 49/02*    (2006.01)
  *H01L 29/78*    (2006.01)

(52) U.S. Cl.
  CPC .. *H01L 27/10814* (2013.01); *H01L 27/10817* (2013.01); *H01L 27/10897* (2013.01); *H01L 28/90* (2013.01); *H01L 29/7827* (2013.01); *G11C 11/4091* (2013.01); *G11C 11/4094* (2013.01)

(56) References Cited

U.S. PATENT DOCUMENTS

| | | |
|---|---|---|
| 2012/0153357 A1 | 6/2012 | Tang et al. |
| 2013/0270626 A1 | 10/2013 | Lue |
| 2014/0346649 A1 | 11/2014 | Leedy |
| 2015/0179663 A1 | 6/2015 | Lee et al. |
| 2016/0260778 A1 | 9/2016 | Castro |

* cited by examiner

INTEGRATED MEMORY ASSEMBLIES COMPRISING MULTIPLE MEMORY ARRAY DECKS

RELATED PATENT DATA

This patent claims priority to U.S. Provisional Patent Application Ser. No. 62/452,193, which was filed Jan. 30, 2017.

TECHNICAL FIELD

Integrated memory assemblies comprising multiple memory array decks.

BACKGROUND

Memory is utilized in modern computing architectures for storing data. One type of memory is Dynamic Random Access Memory (DRAM). DRAM may provide advantages of structural simplicity, low cost and high speed in comparison to alternative types of memory.

DRAM may utilize memory cells each having one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art memory cell 1T-1C memory cell configuration is shown in FIG. 2. The configuration of FIG. 2 shows two memory cells 2a and 2b; with memory cell 2a comprising a transistor T1 and a capacitor C1, and with memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

Another prior art memory cell configuration utilizes two transistors in combination with one capacitor. Such configuration may be referred to as a 2T-1C memory cell. A 2T-1C memory cell 4 is schematically illustrated in FIG. 3. The two transistors are labeled T1 and T2; and may be referred to as first and second transistors, respectively. The capacitor is labeled C.

A source/drain region of the first transistor T1 connects with a first node of the capacitor C, and the other source/drain region of the first transistor T1 connects with a first comparative bitline (BL-T). A gate of the first transistor T1 connects with a wordline WL. A source/drain region of the second transistor T2 connects with a second node of the capacitor C, and the other source/drain region of the second transistor T2 connects with a second comparative bitline BL-C. A gate of the second transistor T2 connects with the wordline WL.

The comparative bitlines BL-T and BL-C extend to a sense amplifier SA which compares electrical properties (e.g., voltage) of the two to ascertain a memory state of memory cell 4. The bitline BL-T may be referred to as a true bitline, and the bitline BL-C may be referred to as a complementary bitline. The terms "true" and "complementary" are arbitrary, and merely indicate that the bitline values of BL-T and BL-C are to be compared to one another.

Another prior art memory cell configuration utilizes two capacitors in combination with two transistors. Such configuration may be referred to as a 2T-2C memory cell. A 2T-2C memory cell 6 is schematically illustrated in FIG. 4. The two transistors of the memory cell are labeled T1 and T2, and may be referred to as first and second transistors, respectively. The two capacitors are labeled C1 and C2, and may be referred to as first and second capacitors, respectively.

A source/drain region of the first transistor T1 connects with a node of the first capacitor C1, and the other source/drain region of the first transistor T1 connects with a first comparative bitline BL-T. A gate of the first transistor T1 connects with a wordline WL. A source/drain region of the second transistor T2 connects with a node of the second capacitor C2, and the other source/drain region of the second transistor T2 connects with a second comparative bitline BL-C. A gate of the second transistor T2 connects with the wordline WL. Each of the first and second capacitors C1 and C2 has a node electrically coupled with a common plate CP.

The comparative bitlines BL-T and BL-C extend to a sense amplifier SA which compares electrical properties (e.g., voltage) of the two to ascertain a memory state of memory cell 6.

Another prior art memory cell configuration utilizes three transistors in combination with one capacitor. Such configuration may be referred to as a 3T-1C memory cell. A 3T-1C memory cell 8 is schematically illustrated in FIG. 5. The three transistors of the memory cell are labeled T1, T2 and T3; and may be referred to as first, second and third transistors, respectively. The capacitor is labeled C.

A source/drain region of the first transistor T1 connects with a write bitline WBL, and the other source/drain region of the first transistor T1 connects with the capacitor C. A gate of the first transistor T1 connects with a write wordline WWL.

A source/drain region of the second transistor T2 connects with a common plate CP, and the other source/drain region of the second transistor T2 connects with a source/drain region of the third transistor T3.

A gate of the second transistor T2 connects with the capacitor C.

One of the source/drain regions of the third transistor T3 is the source/drain region connected with the source/drain region of the second transistor T2, and the other connects with a read bitline RBL. A gate of the third transistor T3 connects with a read wordline RWL.

The memory cells of FIGS. 1-5 may be incorporated into memory arrays. The 1T-1C memory cells of FIGS. 1 and 2 may be utilized in memory arrays having open bitline arrangements, with the open bitline arrangements having paired bitlines which are compared with sense amplifiers. An example DRAM array 9 having open bitline architecture is shown in FIG. 6. The DRAM array 9 includes memory cells of the type described in FIG. 2 (not labeled in FIG. 6 in order to simplify the drawing), wordlines, WL(0-7), and comparative bitlines. The comparative bitlines include a first set BL-T(1-9), and a second set BL-C(1-9). Electrical properties of bitlines from the first set are compared with electrical properties of bitlines from the second set utilizing sense amplifiers, SA(1-9). The wordlines are coupled with wordline drivers.

It would be desirable to incorporate memory into three-dimensional arrangements having stacked memory array decks (i.e., tiers). However, such can be complicated due to wiring associated with each memory array deck needing to be extended to circuitry peripheral to the memory array deck. For instance, bitlines may need to extend sense amplifiers and/or other peripheral circuitry; and wordlines may need to extend to wordline drivers and/or other peripheral circuitry. It would be desirable to develop wiring arrangements (e.g., bitline/wordline arrangements) suitable for utilization with stacked memory array decks.

DETAILED DESCRIPTION OF THE ILLUSTRATED EMBODIMENTS

Some embodiments include new architectures having stacked memory array deck arrangements. The new architectures may enable bitlines from different memory array decks to share conductive paths to sense amplifiers and/or may enable wordlines from different memory array decks to share conductive paths to wordline drivers. The new architectures may include isolation devices which enable some memory array decks of the stack to be isolated while another memory array deck of the stack is operated (e.g., subjected to read/write applications). Example embodiments are described with reference to FIGS. 7-24.

Figure 1:
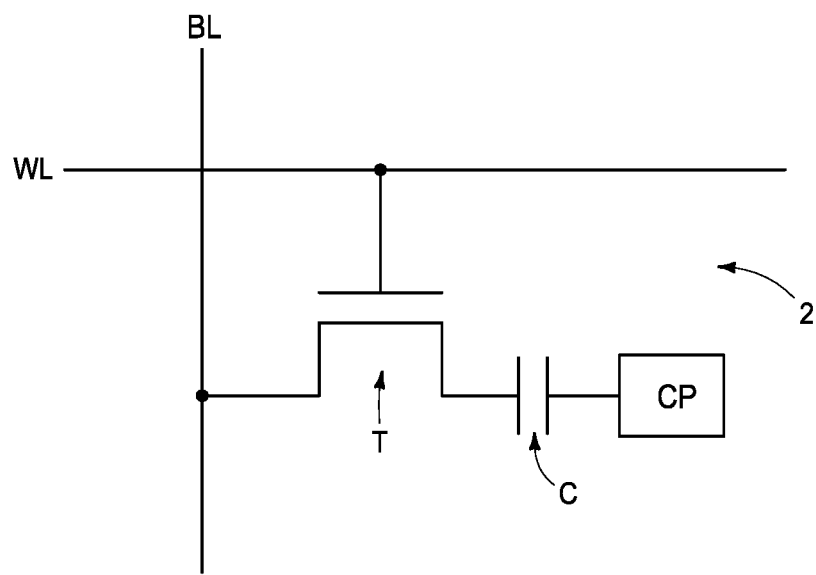
FIG. 1 is a schematic diagram of a prior art memory cell having 1 transistor and 1 capacitor.
Figure 2:
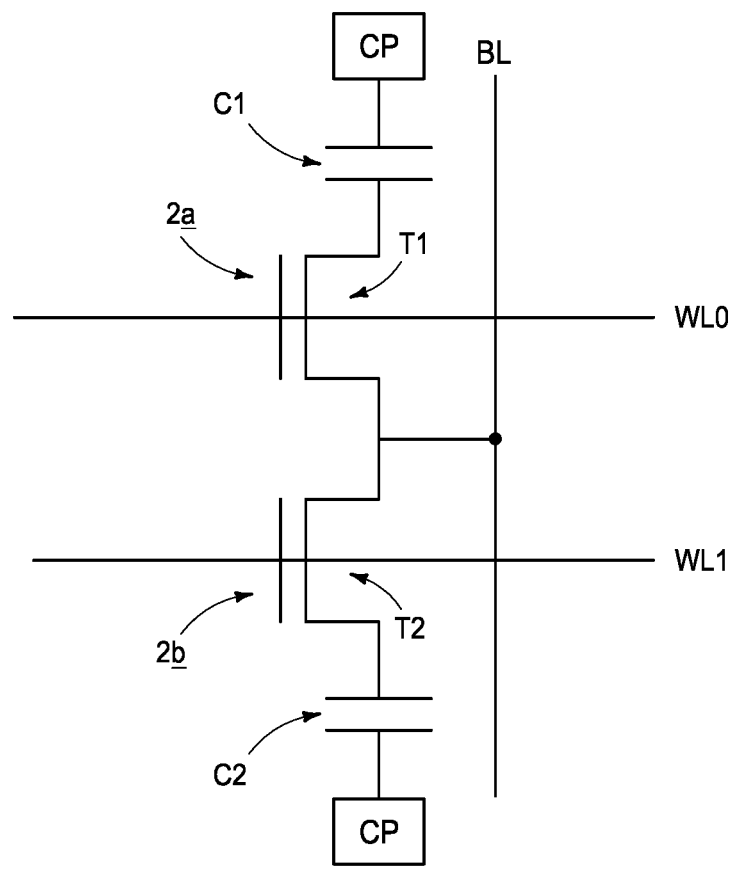
FIG. 2 is a schematic diagram of a pair of prior art memory cells which each have 1 transistor and 1 capacitor, and which share a bitline connection.
Figure 3:
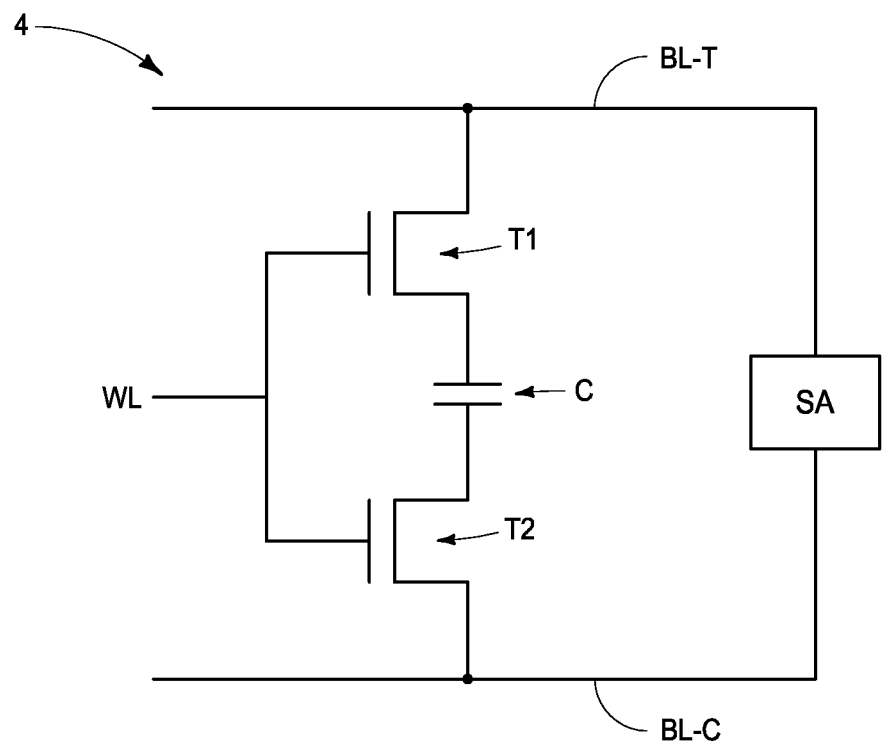
FIG. 3 is a schematic diagram of a prior art memory cell having 2 transistors and 1 capacitor.
Figure 4:
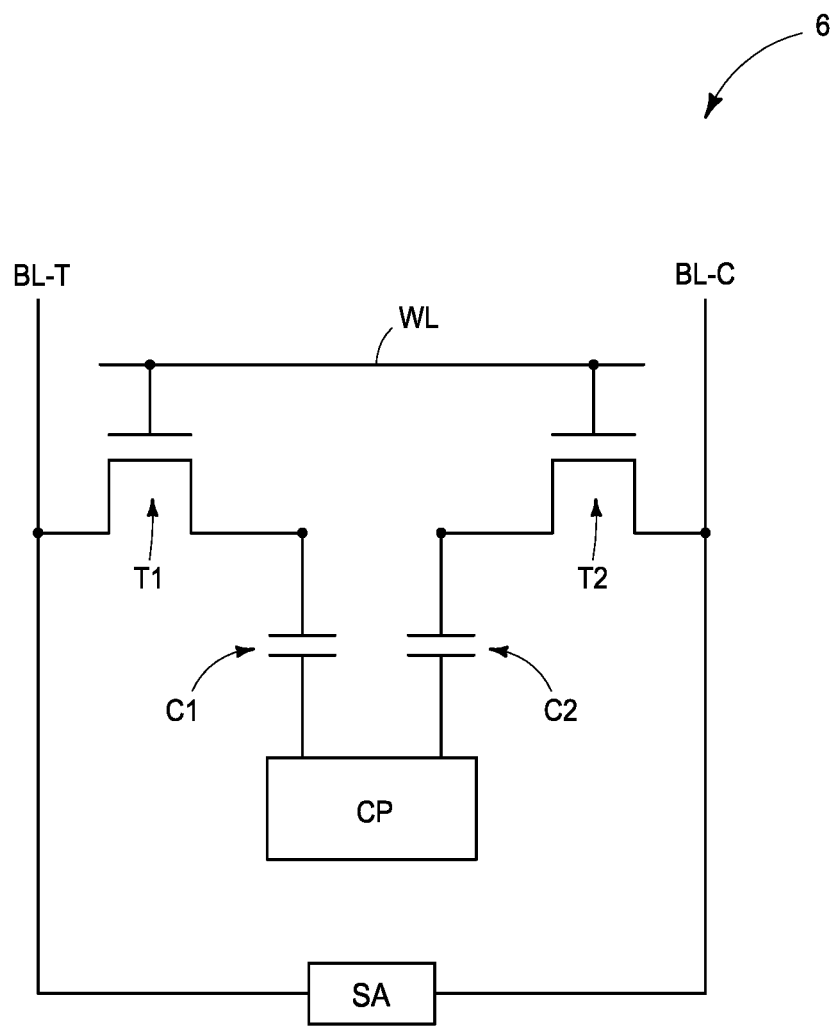
FIG. 4 is a schematic diagram of a prior art memory cell having 2 transistors and 2 capacitors.
Figure 5:
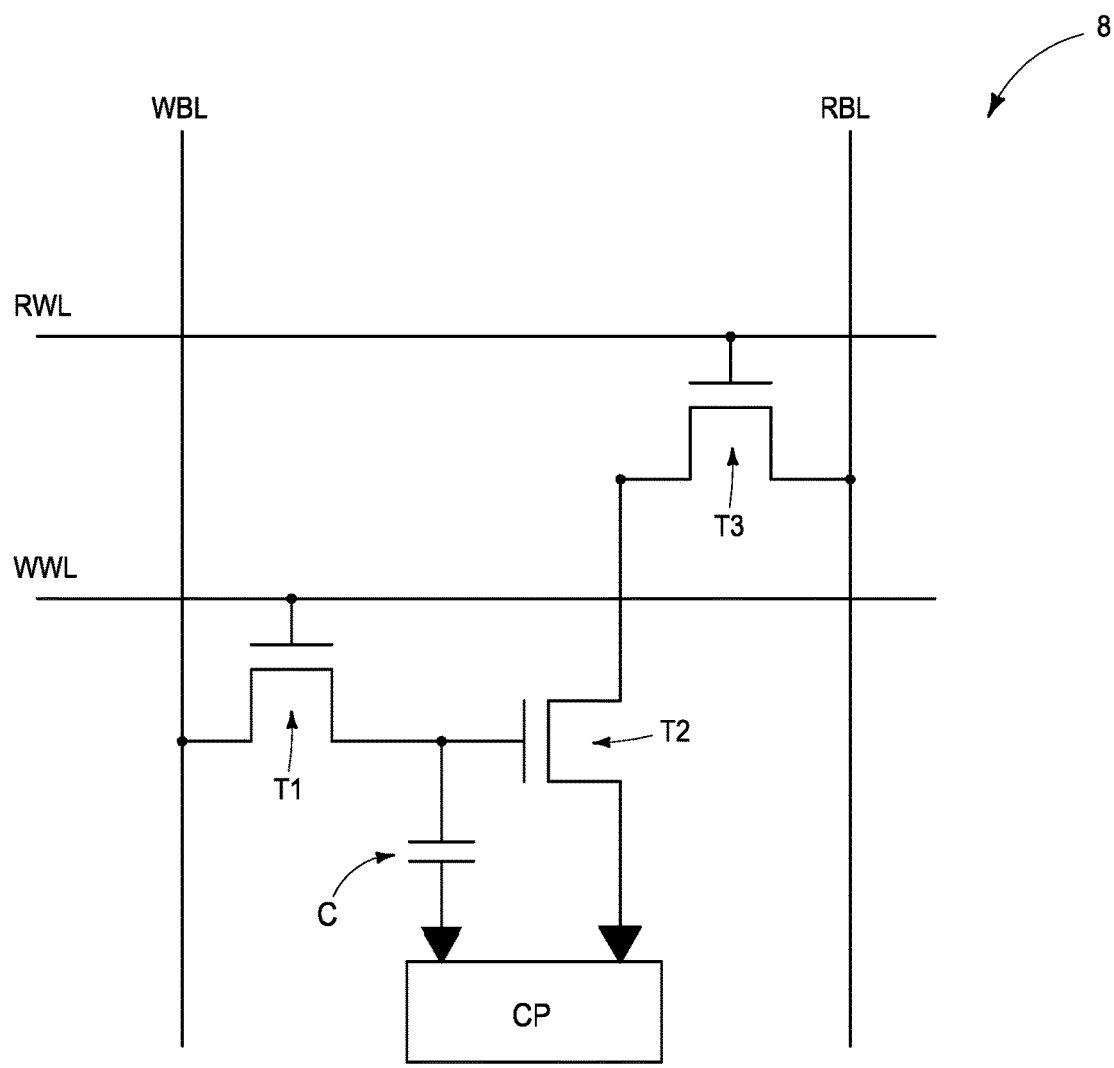
FIG. 5 is a schematic diagram of a prior art memory cell having 3 transistors and 1 capacitor.
Figure 6:
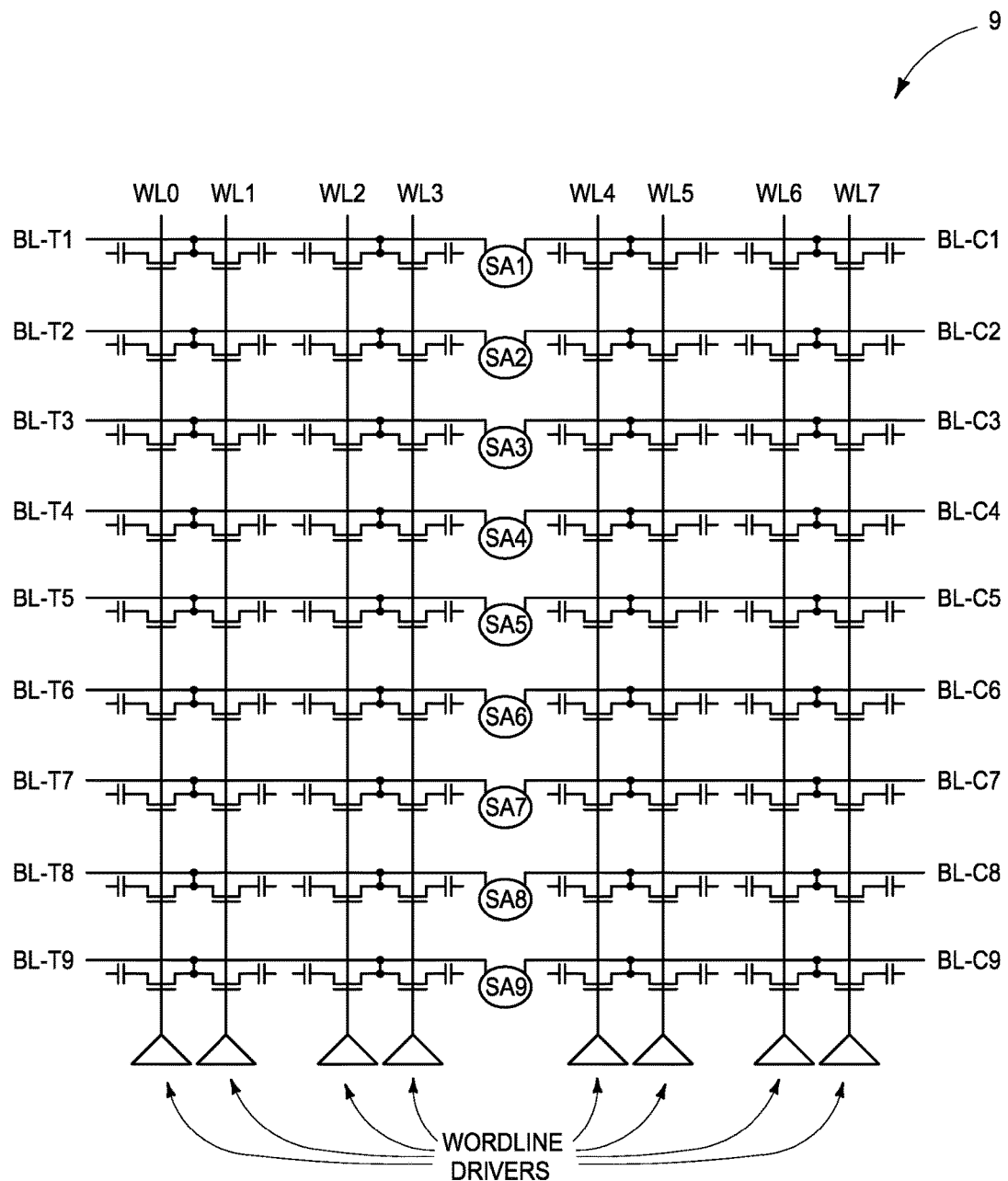
FIG. 6 is a schematic diagram of a prior art DRAM array having open bitline architecture.
Figure 7:
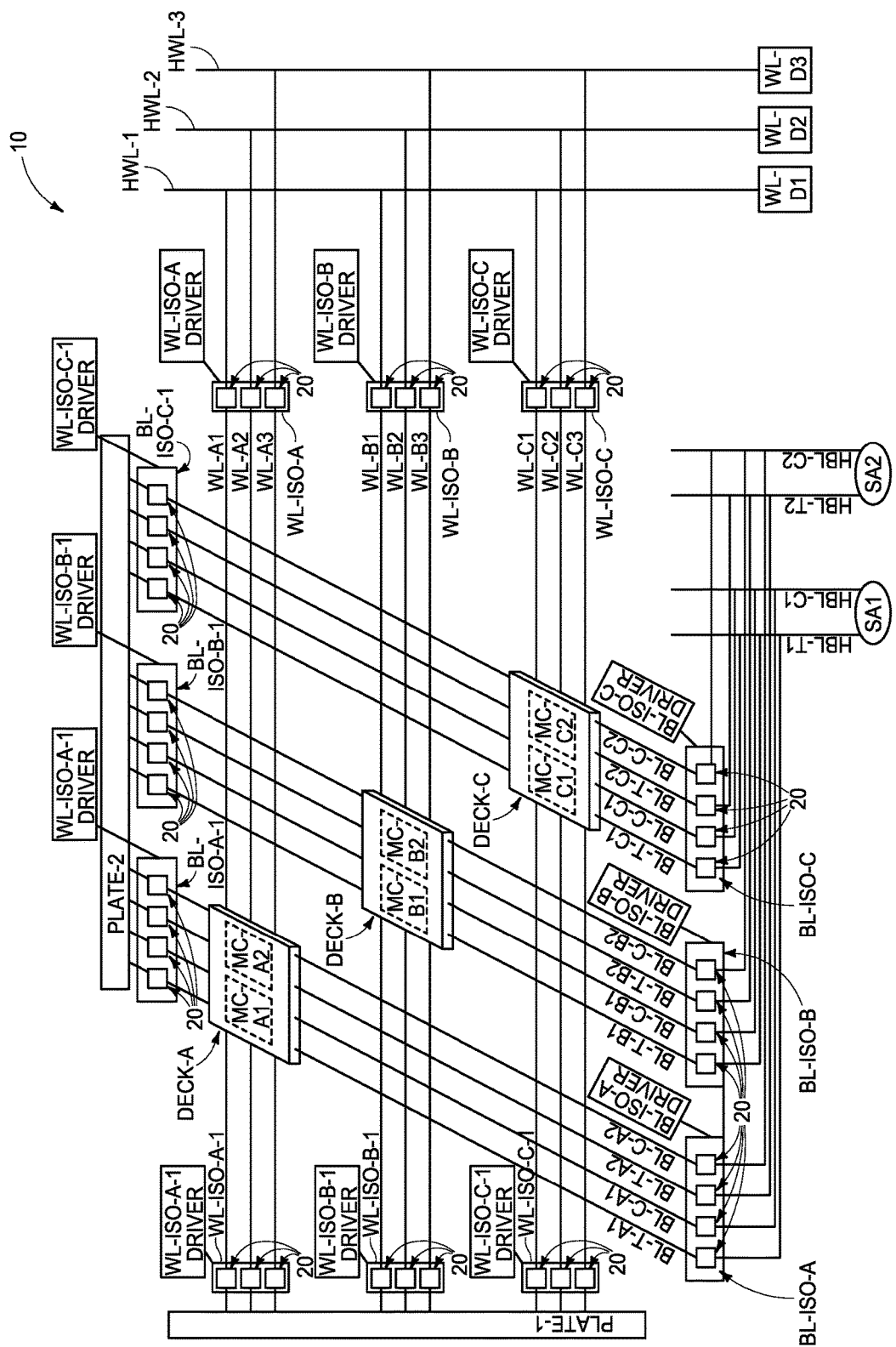
FIG. 7 is a schematic diagram of an example integrated memory assembly having multiple memory array decks.

Referring to FIG. 7, an example integrated memory assembly 10 is illustrated. The assembly 10 comprises three decks, which are labeled as DECK-A, DECK-B and DECK-C. The decks comprise memory arrays, and may be referred to as memory array decks. Although three stacked decks are illustrated, in practice the assembly may comprise more than three stacked decks, or may comprise only two stacked decks. The stacked decks may be supported by an underlying base (not shown in FIG. 7). Such base may comprise, for example, monocrystalline silicon and/or any other suitable material.

Each of the stacked decks is diagrammatically illustrated to comprise memory cells; with DECK-A having the illustrated memory cells MC-A1 and MC-A2, DECK-B having the illustrated memory cells MC-B1 and MC-B2, and DECK-C having the illustrated memory cells MC-C1 and MC-C2. Although each deck is shown comprising only a pair of memory cells in order to simplify the drawing, in practice the decks may comprise memory arrays having large quantities of memory cells; such as, for example, hundreds of memory cells, thousands of memory cells, millions of memory cells, billions of memory cells, etc. Approximate boundaries of the illustrated memory cells are diagrammatically illustrated with dashed-lines.

The memory cells utilized in DECKs A-C may include any suitable memory cells, such as, for example, 1T-1C memory cells, 2T-1C memory cells, 2T-2C memory cells, 3T-1C memory cells, etc. The memory cells utilized in DECK-A (MC-A1 and MC-A2) may include the same type of memory cells as are utilized in one or both of DECKs B and C, or may differ from the type of memory cells utilized in at least one of DECKs B and C.

Wordlines extend across the memory array decks; with the wordlines across DECK-A being labeled WL-A1, WL-A2 and WL-A3, the wordlines across DECK-B being labeled WL-B1, WL-B2 and WL-B3, and the wordlines across DECK-C being labeled WL-C1, WL-C2 and WL-C3. Although only three wordlines are shown extending across each memory array deck in order to simplify the illustration; there may be many more wordlines in practice, as will be clear to persons of ordinary skill in the art. In some embodiments, the wordlines across DECK-A may be considered to be a first series of wordlines, the wordlines across DECK-B may be considered to be a second series of wordlines, and the wordlines across DECK-C may be considered to be a third series of wordlines.

Bitlines extend across the memory array decks; with the bitlines being provided as paired comparative bitlines. Specifically, a "T" bitline is paired with a "C" bitline in configurations that may be analogous to those described with reference to the prior art memory cells and arrays described above in the BACKGROUND, and in operation an electrical value of the "T" bitline is compared to an electrical value of the "C" bitline utilizing a sense amplifier.

The bitlines across DECK-A include paired comparative bitlines BL-T-A1 and BL-C-A1, and BL-T-A2 and BL-C-A2. The bitlines across DECK-B include paired comparative bitlines BL-T-B1 and BL-C-B1, and BL-T-B2 and BL-C-B2. The bitlines across DECK-C include paired comparative bitlines BL-T-C1 and BL-C-C1, and BL-T-C2 and BL-C-C2. Although only two sets of paired comparative bitlines are shown extending across each memory array deck in order to simplify the illustration; there may be many more sets of paired comparative bitlines in practice, as will be clear to persons of ordinary skill in the art. In some embodiments, the bitlines across DECK-A may be considered to be a first series of bitlines, the bitlines across DECK-B may be considered to be a second series of bitlines, and the bitlines across DECK-C may be considered to be a third series of bitlines.

The wordlines and bitlines are conductive lines, and in some embodiments the term "conductive line" may be used to generically refer to wordlines and/or bitlines.

The wordlines WL-A1, WL-A2 and WL-A3 pass through wordline isolation circuitry (labeled as WL-ISO-A) and then join with conductive paths (labeled as HWL-1, HWL-2 and HWL-3) which extend to wordline drivers WL-D1, WL-D2 and WL-D3. The wordlines WL-B1, WL-B2 and WL-B3 pass through wordline isolation circuitry (labeled as WL-ISO-B) and then join with the conductive paths HWL-1, HWL-2 and HWL-3. The wordlines WL-C1, WL-C2 and WL-C3 pass through wordline isolation circuitry (labeled as WL-ISO-C) and then join with the conductive paths HWL-1, HWL-2 and HWL-3.

The conductive paths HWL-1, HWL-2 and HWL-3 are labeled as "HWL" paths to indicate that they may be considered as "hierarchical wordline" paths. The conductive paths HWL-1, HWL-2 and HWL-3 may be referred to as first, second and third conductive wordline paths, respectively.

The wordline drivers WL-D1, WL-D2 and WL-D3 may be in any suitable location relative to the stacked memory array decks (i.e., DECK-A, DECK-B and DECK-C); and in some embodiments may be below the stacked memory array decks, above the stacked memory array decks, or laterally adjacent the stacked memory array decks. The wordline drivers WL-D1, WL-D2 and WL-D3 may be referred to as first, second and third wordline drivers, respectively. In some embodiments, the wordline drivers WL-D1, WL-D2 and WL-D3 may be considered to be components which are electrically coupled with conductive lines (wordlines) utilizing the conductive paths HWL-1, HWL-2 and HWL-3.

The wordline isolation circuitry WL-ISO-A comprises transistors 20, and is configured to enable the wordlines of DECK A to be electrically isolated from the conductive paths HWL-1, HWL-2 and HWL-3 when another deck (i.e., DECK-B or DECK-C) is being accessed for operation (e.g., reading, writing, etc.); while enabling the wordlines of DECK-A to be electrically coupled with the conductive paths HWL-1, HWL-2 and HWL-3 when DECK-A is being accessed for operation. Similarly, the wordline isolation circuitries WL-ISO-B and WL-ISO-B comprise transistors 20 and are configured to enable the wordlines of DECKs B and C, respectively, to be electrically isolated from the conductive paths HWL-1, HWL-2 and HWL-3 when another deck is being accessed for operation; while enabling the wordlines of either DECK-B or DECK-C to be electrically coupled with the conductive paths HWL-1, HWL-2 and HWL-3 when such deck is being accessed for operation.

The electrical coupling of a deck (e.g., DECK-A, DECK-B or DECK-C) to the conductive paths HWL-1, HWL-2 and HWL-3 enables electrical coupling of the wordlines of the deck to the associated wordline drivers WL-D1, WL-D2 and Wl-D3; and the electrical isolation of the deck (e.g., DECK-A, DECK-B or DECK-C) from the conductive paths HWL-1, HWL-2 and HWL-3 enables electrical isolation of the wordlines of the deck from the associated wordline drivers.

The wordline isolation circuitries WL-ISO-A, WL-ISO-B and WL-ISO-C are coupled with drivers WL-ISO-A DRIVER, WL-ISO-B DRIVER and WL-ISO-C DRIVER, respectively. The wordline isolation circuitries WL-ISO-A, WL-ISO-B and WL-ISO-C are described in more detail below with reference to FIG. 10.

In some embodiments, it may acceptable for the wordlines of a deck to float (i.e., to have no specifically set voltage) when the deck is isolated from the wordline drivers. In other applications, it may be desired to hold the wordlines of the deck at a preset voltage (e.g., ground voltage, common plate voltage, etc.) when the deck is isolated from the wordline drivers. Accordingly, the embodiment of FIG. 7 shows optional structures which may be utilized to hold the wordlines at a preset voltage. Specifically, the wordlines from decks A, B and C (WL-A1, WL-A2, WL-A3, WL-B1, WL-B2, WL-B3, WL-C1, WL-C2 and WL-C3) pass through wordline isolation circuitries (labeled as WL-ISO-A-1, WL-ISO-B-1 and WL-ISO-C-1) to a conductive plate, PLATE-1.

The PLATE-1 may be held at any desired voltage (e.g., ground voltage, common plate voltage, etc.), and may be referred to as a controlled-voltage plate.

The wordline isolation circuitries WL-ISO-A-1, WL-ISO-B-1 and WL-ISO-C-1 may be referred to as second wordline isolation circuitries to distinguish them from the first wordline isolation circuitries WL-ISO-A, WL-ISO-B and WL-ISO-C described above.

In the shown embodiment, PLATE-1 and the second wordline isolation circuitries (WL-ISO-A-1, WL-ISO-B-1 and WL-ISO-C-1) are proximate the stacked memory array decks (DECK-A, DECK-B, DECK-C) and laterally offset from the stacked memory array decks. The first wordline isolation circuitries (WL-ISO-A, WL-ISO-B and WL-ISO-C) and associated conductive paths (HWL-1, HWL-2 and HWL-3) are also proximate the stacked memory array decks (DECK-A, DECK-B, DECK-C) and laterally offset from the stacked memory array decks; and are along an opposing side of the stacked memory array decks from PLATE-1 and the second wordline isolation circuitries (WL-ISO-A-1, WL-ISO-B-1 and WL-ISO-C-1).

The wordline isolation circuitries WL-ISO-A-1, WL-ISO-B-1 and WL-ISO-C-1 are coupled with drivers WL-ISO-A-1 DRIVER, WL-ISO-B-1 DRIVER and WL-ISO-C-1 DRIVER, respectively.

The wordline isolation circuitries WL-ISO-A-1, WL-ISO-B-1 and WL-ISO-C-1 comprise transistors 20, and are configured to enable the wordlines of one of the stacked decks (DECK-A, DECK-B, DECK-C) to be electrically isolated from PLATE-1 when the deck is being accessed for operation; while enabling the wordlines of the other decks to be electrically coupled with PLATE-1 and held at a preset voltage. The wordline isolation circuitries WL-ISO-A-1, WL-ISO-B-1 and WL-ISO-C-1 are described in more detail below with reference to FIG. 13.

In the description above, the wordline isolation circuitries WL-ISO-A, WL-ISO-B and WL-ISO-C are referred to as first wordline isolation circuitries, and the wordline isolation circuitries WL-ISO-A-1, WL-ISO-B-1 and WL-ISO-C-1 are referred to as second wordline isolation circuitries. In alternative descriptions, the wordline isolation circuitries WL-ISO-A, WL-ISO-B and WL-ISO-C may be referred to as first, second and third wordline isolation circuitries, respectively; and the wordline isolation circuitries WL-ISO-A-1, WL-ISO-B-1 and WL-ISO-C-1 may be referred to as fourth, fifth and sixth wordline isolation circuitries, respectively.

The electrical flow along the bitlines of the various stacked memory array decks (i.e., DECK-A, DECK-B and DECK-C) may also be controlled with isolation circuitry. In the embodiment of FIG. 7, the bitlines BL-T-A1, BL-C-A1, BL-T-A2 and BL-C-A2 pass through bitline isolation circuitry (labeled as BL-ISO-A) and then join with conductive paths (labeled as HBL-T1, HBL-C1, HBL-T2 and HBL-C2) which extend to sense amplifiers SA1 and SA2. The bitlines BL-T-B1, BL-C-B1, BL-T-B2 and BL-C-B2 pass through bitline isolation circuitry (labeled as BL-ISO-B) and then join with the conductive paths HBL-T1, HBL-C1, HBL-T2 and HBL-C2. The bitlines BL-T-C1, BL-C-C1, BL-T-C2 and BL-C-C2 pass through bitline isolation circuitry (labeled as BL-ISO-C) and then join with the conductive paths HBL-T1, HBL-C1, HBL-T2 and HBL-C2. In some embodiments, the sense amplifiers SA1 and SA2 may be referred to as first and second sense amplifiers, respectively.

In some embodiments, the sense amplifiers SA1 and SA2 may be considered to be components which are electrically coupled to the conductive lines (bitlines) utilizing the conductive bitline paths HBL-T1, HBL-C1, HBL-T2 and HBL-C2.

The conductive paths HBL-T1, HBL-C1, HBL-T2 and HBL-C2 are labeled as "HBL" paths to indicate that they may be considered as "hierarchical bitline" paths. In some embodiments, the conductive paths HBL-T1 and HBL-C1 may be referred to as a first HBL-T path and a first HBL-C path, respectively; and the conductive paths HBL-T2 and HBL-C2 may be referred to as a second HBL-T path and a second HBL-C path, respectively.

The sense amplifiers SA1 and SA2 may be in any suitable location relative to the stacked memory array decks (i.e., DECK-A, DECK-B and DECK-C); and in some embodiments may be below the stacked decks, above the stacked decks, or laterally adjacent the stacked decks.

The bitline isolation circuitry BL-ISO-A comprises transistors 20, and is configured to enable the bitlines of DECK-A to be electrically isolated from the conductive paths HBL-T1, HBL-C1, HBL-T2 and HBL-C2 when another deck (i.e., DECK-B or DECK-C) is being accessed for operation (e.g., reading, writing, etc.); while enabling the bitlines of DECK-A to be electrically coupled with the conductive paths HBL-T1, HBL-C1, HBL-T2 and HBL-C2 when DECK-A is being accessed for operation. Similarly, the bitline isolation circuitries BL-ISO-B and BL-ISO-C comprise transistors 20, and are configured to enable the bitlines of DECKs B and C, respectively, to be electrically isolated from the conductive paths HBL-T1, HBL-C1, HBL-T2 and HBL-C2 when another deck is being accessed for operation; while enabling the bitlines of either DECK-B or DECK-C to be electrically coupled with the conductive paths HBL-T1, HBL-C1, HBL-T2 and HBL-C2 when such deck is being accessed for operation.

The electrical coupling of a deck (e.g., DECK-A, DECK-B or DECK-C) to the conductive paths HBL-T1, HBL-C1, HBL-T2 and HBL-C2 enables electrical coupling of the comparative bitlines of the deck to the associated sense amplifiers SA1 and SA2; and the electrical isolation of the deck (e.g., DECK-A, DECK-B or DECK-C) from the conductive paths HBL-T1, HBL-C1, HBL-T2 and HBL-C2 enables electrical isolation of the comparative bitlines of the deck from the associated sense amplifiers.

The bitline isolation circuitries BL-ISO-A, BL-ISO-B and BL-ISO-C are coupled with drivers BL-ISO-A DRIVER, BL-ISO-B DRIVER and BL-ISO-C DRIVER, respectively. The bitline isolation circuitries (specifically, BL-ISO-A and BL-ISO-B) are described in more detail below with reference to FIG. 9.

In some embodiments, it may be acceptable for the bitlines of a deck to float (i.e., to have no specifically set voltage) when the deck is isolated from the sense amplifiers. In other applications, it may be desired to hold the bitlines of the deck at a preset voltage (e.g., ground voltage, common plate voltage, etc.) when the deck is isolated from the sense amplifiers. Accordingly, the embodiment of FIG. 7 shows optional structures which may be utilized to hold the bitlines at a preset voltage. Specifically, the bitlines from decks A, B and C (BL-T-A1, BL-C-A1, BL-T-A2, BL-C-A2, BL-T-B1, BL-C-B1, BL-T-B2, BL-C-B2, BL-T-C1, BL-C-C1, BL-T-C2 and BL-C-C2) pass through bitline isolation circuitries (labeled as BL-ISO-A-1, BL-ISO-B-1 and BL-ISO-C-1) to a conductive plate, PLATE-2. The PLATE-2 may be held at any desired voltage (e.g., ground voltage, common plate voltage, etc.), and may be referred to as a controlled-voltage plate. PLATE-2 may be held at the same voltage as PLATE-1, and in some embodiments PLATE-1 and PLATE-2 may be a single structure rather than being two separate structures.

The bitline isolation circuitries BL-ISO-A-1, BL-ISO-B-1 and BL-ISO-C-1 may be referred to as second bitline isolation circuitries to distinguish them from the first bitline isolation circuitries BL-ISO-A, BL-ISO-B and BL-ISO-C described above.

In the shown embodiment, PLATE-2 and the second bitline isolation circuitries (BL-ISO-A-1, BL-ISO-B-1 and BL-ISO-C-1) are proximate the stacked memory array decks (DECK-A, DECK-B, DECK-C) and laterally offset from the stacked memory array decks. The first bitline isolation circuitries (BL-ISO-A, BL-ISO-B and BL-ISO-C) and associated conductive paths (HBL-T1, HBL-C1, HBL-T2 and HBL-C2) are also proximate the stacked memory array decks (DECK-A, DECK-B, DECK-C) and laterally offset from the stacked memory array decks; and are along an opposing side of the stack memory array decks from PLATE-2 and the second bitline isolation circuitries (WL-ISO-A-1, WL-ISO-B-1 and WL-ISO-C-1).

The second bitline isolation circuitries BL-ISO-A-1, BL-ISO-B-1 and BL-ISO-C-1 are coupled with drivers BL-ISO-A-1 DRIVER, BL-ISO-B-1 DRIVER and WB-ISO-C-1 DRIVER, respectively.

The bitline isolation circuitries BL-ISO-A-1, BL-ISO-B-1 and BL-ISO-C-1 comprise transistors 20, and are configured to enable the bitlines of one of the stacked decks (DECK-A, DECK-B, DECK-C) to be electrically isolated from PLATE-2 when the deck is being accessed for operation; while enabling the bitlines of the other decks to be electrically coupled with PLATE-2 and held at a preset voltage. The bitline isolation circuitries (specifically, BL-ISO-A-1 and BL-ISO-B-1) are described in more detail below with reference to FIG. 12.

In the description above, the bitline isolation circuitries BL-ISO-A, BL-ISO-B and BL-ISO-C are referred to as first bitline isolation circuitries, and the bitline isolation circuitries BL-ISO-A-1, BL-ISO-B-1 and BL-ISO-C-1 are referred to as second bitline isolation circuitries. In some embodiments, the bitline isolation circuitries BL-ISO-A, BL-ISO-B and BL-ISO-C may be referred to as first, second and third bitline isolation circuitries, respectively, and the bitline isolation circuitries BL-ISO-A-1, BL-ISO-B-1 and BL-ISO-C-1 may be referred to as fourth, fifth and sixth bitline isolation circuitries, respectively.

The various bitline isolation circuitries (BL-ISO-A, BL-ISO-B, BL-ISO-C, BL-ISO-A-1, BL-ISO-B-1 and BL-ISO-C-1) and wordline isolation circuitries (WL-ISO-A, WL-ISO-B, WL-ISO-C, WL-ISO-A-1, WL-ISO-B-1 and WL-ISO-C-1) described with reference to FIG. 7 may be generically referred to as isolation circuitries in the discussion and claims that follow. It may be advantageous to utilize both bitline isolation circuitries and wordline isolation circuitries in conjunction with stacked memory array decks (as shown in FIG. 7). However, it is to be understood that there may also be stacked-memory-array-deck applications in which bitline isolation circuitries are utilized without accompanying wordline isolation circuitries, or in which wordline isolation circuitries are utilized without accompanying bitline isolation circuitries; and such applications, although not specifically shown, are encompassed by various embodiments described herein.

Figure 8:
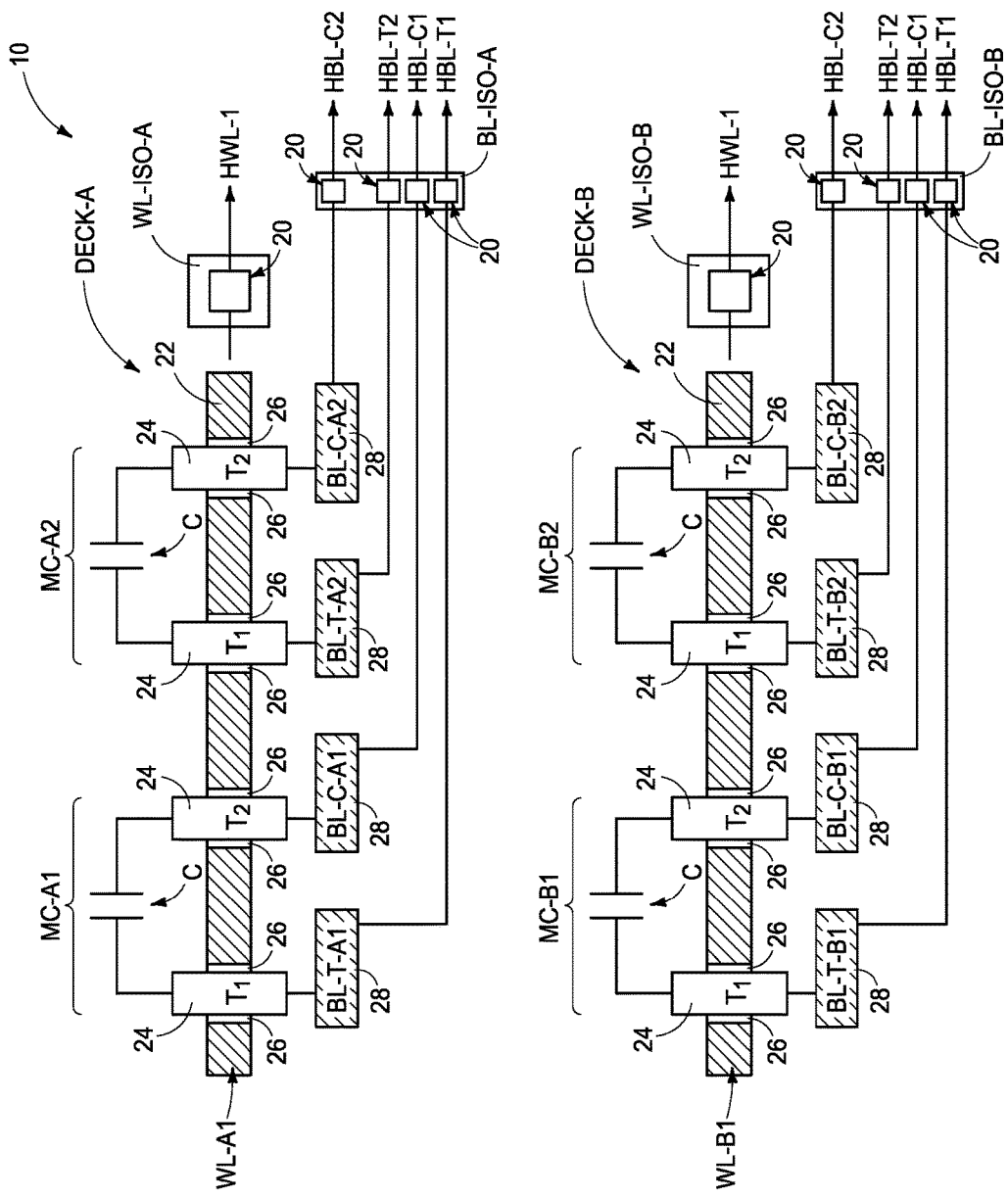
FIGS. 8-13 are schematic diagrams of regions of the example integrated memory assembly of FIG. 7.

FIG. 8 shows portions of the integrated memory assembly 10 of FIG. 7, and specifically illustrates example memory cells MC-A1, MC-A2, MC-B1 and MC-B2 of DECKs A and B. The example memory cells are 2T-1C memory cells, with each memory cell comprising a pair of transistors (T1 and T2), and a capacitor (C) having one electrode coupled with the transistor T1 and another electrode coupled with the transistor T2. In the illustrated embodiment, the wordlines WL-A1 and WL-B1 are lines of conductive material 22 extending along a horizontal direction, and the transistors (T1 and T2) comprise semiconductor material 24 which extends through the conductive material 22. The transistors also comprise a gate dielectric material 26 which is provided between the conductive material 22 of the wordlines (WL-A1 and WL-B1) and the semiconductor material 24. Although it appears that the wordlines WL-A1 and WL-B1 are broken by the dielectric material 26 and semiconductor material 24 of transistors T1 and T2 in the cross-sectional view of FIG. 8, in practice the conductive material 22 of the wordlines may extend around the materials 24 and 26 in regions outside of the illustrated plane of FIG. 8.

The semiconductor material 24 may comprise any suitable material; and in some embodiments may comprise appropriately-doped silicon.

The gate dielectric material 26 may comprise any suitable material, and in some embodiments may comprise silicon dioxide. In some embodiments, the gate dielectric material 26 may be referred to simply as dielectric material.

The bitlines (BL-T-A1, BL-C-A1, BL-T-A2, BL-C-A2, BL-T-B1, BL-C-B1, BL-T-B2 and BL-C-B2) are illustrated to be lines of conductive material 28 extending into and out of the page relative to the cross-sectional view of FIG. 8. The conductive material 28 of the bitlines may be compositionally the same as the conductive material 22 of the wordlines in some embodiments, and in other embodiments may be compositionally different than the conductive material 22.

The wordlines WL-A1 and WL-B1 extend to the conductive path HWL-1 through the isolation circuitries WL-ISO-A and WL-ISO-B, respectively. The bitlines BL-T-A1, BL-C-A1, BL-T-A2 and BL-C-A2 extend to the conductive paths HBL-T1, HBL-C1, HBL-T2 and HBL-C2 through the isolation circuitry BL-ISO-A; and the bitlines BL-T-B1, BL-C-B1, BL-T-B2 and BL-C-B2 extend to the conductive paths HBL-T1, HBL-C1, HBL-T2 and HBL-C2 through the isolation circuitry BL-ISO-B.

Although 2T-1C memory cells are shown in FIG. 8, it is to be understood that other memory cells may be utilized instead of the 2T-1C memory cells. Such other memory cells may be, for example, 1T-1C memory cells, 2T-2C memory cells, 3T-1C memory cells, etc.

Figure 9:
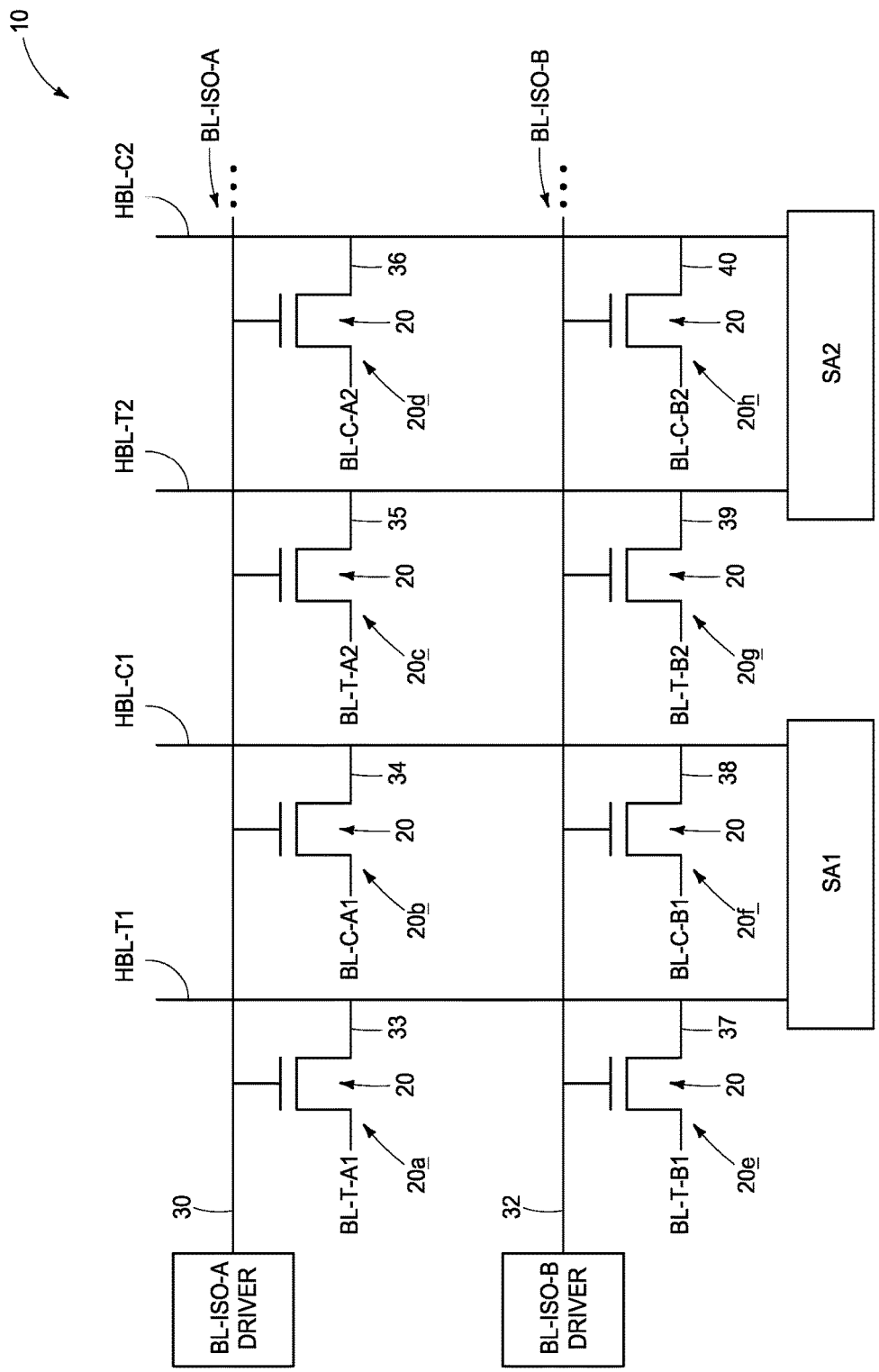

FIG. 9 schematically illustrates regions of the bitline isolation circuitries BL-ISO-A and BL-ISO-B of FIGS. 7 and 8. The BL-ISO-A circuitry includes a conductive line 30 that extends from the BL-ISO-A DRIVER, and which is electrically coupled with the gates of a first series of the transistors 20; and the BL-ISO-B circuitry includes a conductive line 32 that extends from the BL-ISO-B DRIVER, and which is electrically coupled with the gates of a second series of the transistors 20.

In some embodiments, the illustrated transistors 20 of the BL-ISO-A circuitry may be referred to as a first transistor 20a, a second transistor 20b, a third transistor 20c and a fourth transistor 20d; and the illustrated transistors 20 of the BL-ISO-B circuitry may be referred to as a fifth transistor 20e, a sixth transistor 20f, a seventh transistor 20g and an eighth transistor 20h.

The bitlines BL-T-A1, BL-C-A1, BL-T-A2 and BL-C-A2 may be considered to extend through the first isolation circuitry BL-ISO-A to the bitline paths HBL-T1, HBL-C1 HBL-T2 and HBL-C2. The first transistor 20a gatedly connects BL-T-A1 with a first conductive route 33 to the HBL-T1 path (i.e., the first BL-T conductive path); the second transistor 20b gatedly connects BL-C-A1 with a second conductive route 34 to the HBL-C1 path (i.e., the first BL-C conductive path); the third transistor 20c gatedly connects BL-T-A2 with a third conductive route 35 to the HBL-T2 path (i.e., the second BL-T conductive path); and the fourth transistor 20d gatedly connects BL-C-A2 with a fourth conductive route 36 to the HBL-C2 path (i.e., the second BL-C conductive path).

The bitlines BL-T-B1, BL-C-B1, BL-T-B2 and BL-C-B2 may be considered to extend through the second isolation circuitry BL-ISO-B to the bitline paths HBL-T1, HBL-C1 HBL-T2 and HBL-C2. The fifth transistor 20e gatedly connects BL-T-B1 with a fifth conductive route 37 to the HBL-T1 path; the sixth transistor 20f gatedly connects BL-C-B1 with a sixth conductive route 38 to the HBL-C1 path; the seventh transistor 20g gatedly connects BL-T-B2 with a seventh conductive route 39 to the HBL-T2 path; and the eighth transistor 20h gatedly connects BL-C-B2 with an eighth conductive route 40 to the HBL-C2 path.

Figure 10:
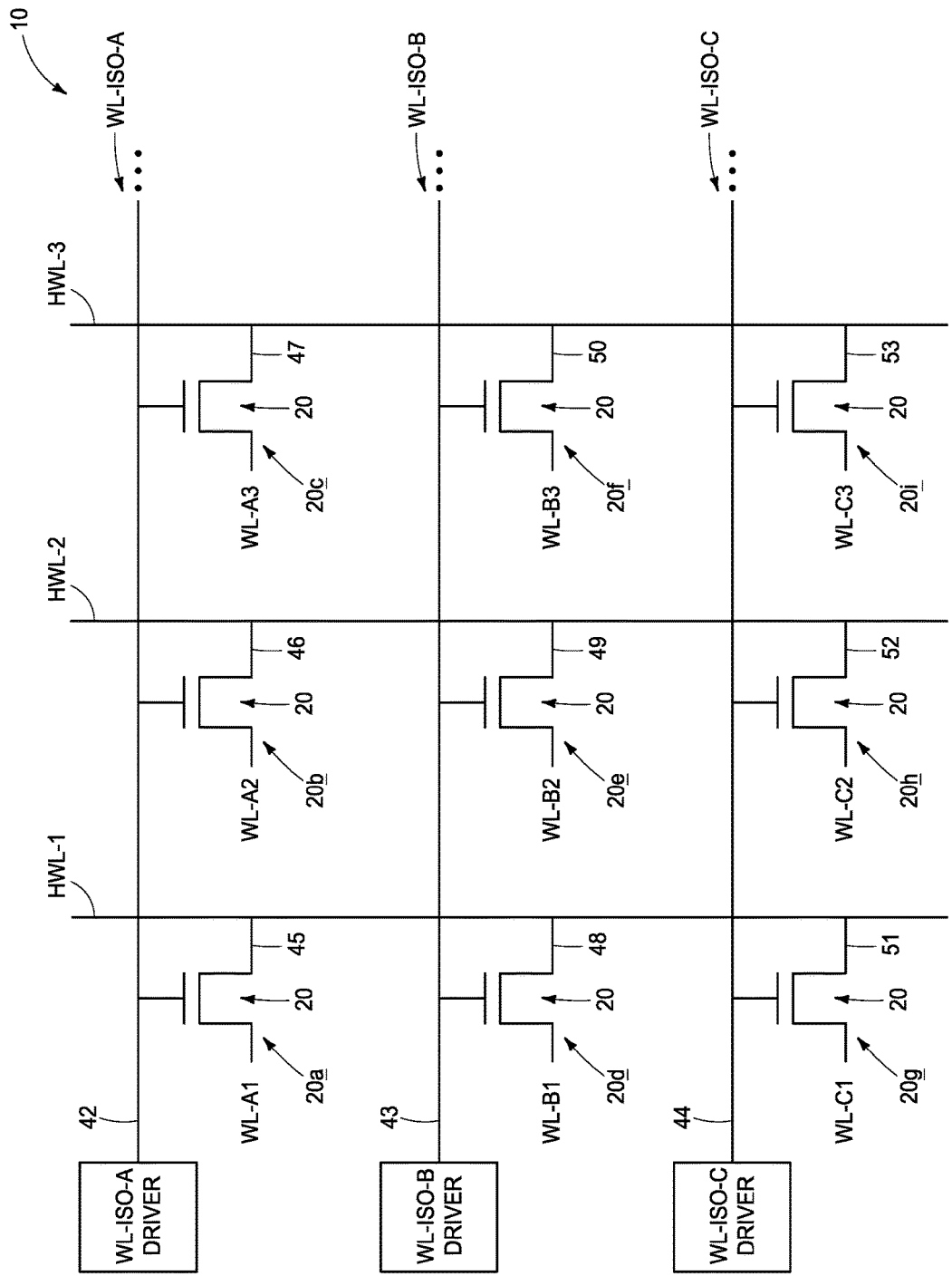

FIG. 10 schematically illustrates regions of the wordline isolation circuitries WL-ISO-A, WL-ISO-B and WL-ISO-C of FIGS. 7 and 8. The WL-ISO-A circuitry includes a conductive line 42 that extends from the WL-ISO-A DRIVER and which is electrically coupled with the gates of a first series of the transistors 20; the WL-ISO-B circuitry includes a conductive line 43 that extends from the WL-ISO-B DRIVER and which is electrically coupled with the gates of a second series of the transistors 20; and the WL-ISO-C circuitry includes a conductive line 44 that extends from the WL-ISO-C DRIVER and which is electrically coupled with the gates of a third series of the transistors 20.

In some embodiments, the illustrated transistors 20 of the WL-ISO-A circuitry may be referred to as a first transistor 20a, a second transistor 20b and a third transistor 20c; the illustrated transistors 20 of the WL-ISO-B circuitry may be referred to as a fourth transistor 20d, a fifth transistor 20e, and a sixth transistor 20f; and the illustrated transistors 20 of the WL-ISO-C circuitry may be referred to as a seventh transistor 20g, an eighth transistor 20h, and a ninth transistor 20i.

The wordlines WL-A1, WL-A2 and WL-A3 may be considered to extend through the first isolation circuitry WL-ISO-A to the wordline paths HWL-1, HWL-2 and HWL-3. The first transistor 20a gatedly connects WL-A1 with a first conductive route 45 to the HWL-1 path (i.e., the first hierarchical wordline conductive path); the second transistor 20b gatedly connects WL-A2 with a second conductive route 46 to the HWL-2 path (i.e., the second hierarchical wordline conductive path); and the third transistor 20c gatedly connects WL-A3 with a third conductive route 47 to the HWL-3 path (i.e., the third hierarchical wordline conductive path).

The wordlines WL-B1, WL-B2 and WL-B3 may be considered to extend through the second isolation circuitry WL-ISO-B to the wordline paths HWL-1, HWL-2 and HWL-3. The fourth transistor 20d gatedly connects WL-B1 with a fourth conductive route 48 to the HWL-1 path; the fifth transistor 20e gatedly connects WL-B2 with a fifth conductive route 49 to the HWL-2 path; and the sixth transistor 20f gatedly connects WL-B3 with a sixth conductive route 50 to the HWL-3 path.

The wordlines WL-C1, WL-C2 and WL-C3 may be considered to extend through the third isolation circuitry WL-ISO-C to the wordline paths HWL-1, HWL-2 and HWL-3. The seventh transistor 20g gatedly connects WL-C1 with a seventh conductive route 51 to the HWL-1 path; the eighth transistor 20*h* gatedly connects WL-C2 with an eighth conductive route 52 to the HWL-2 path; and the ninth transistor 20*i* gatedly connects WL-C3 with a ninth conductive route 53 to the HWL-3 path.

In some embodiments, the numbering of the transistors 20*a-h* of FIG. 9 and/or of transistors 20*a-i* of FIG. 10 may be altered in a particular claim relative to the descriptions in FIGS. 9 and 10, depending on how many total transistors are described in a particular claim set. For instance, if only the transistors 20*a*, 20*b*, 20*d* and 20*e* of FIG. 10 are described in a claim set, then such may be referred to as the first, second, third and fourth transistors, respectively. As another example, if the bitline isolation transistors of FIG. 9 are described in a claim set together with some or all of the wordline isolation transistors of FIG. 10; then the bitline isolation transistors of FIG. 9 may be referred to as the first through eighth transistors and the wordline isolation transistors of FIG. 10 may be referred to as ninth and higher transistors. As another example, if the bitline isolation transistors of FIG. 9 are described in a claim set together with some or all of the wordline transistors of FIG. 10; then the wordline isolation transistors of FIG. 10 may be referred to as the first through sixth transistors (or first through fourth transistors if only some are described in the claim) and the bitline isolation transistors of FIG. 9 may be referred to as the consecutively higher-numbered transistors.

Figure 11:
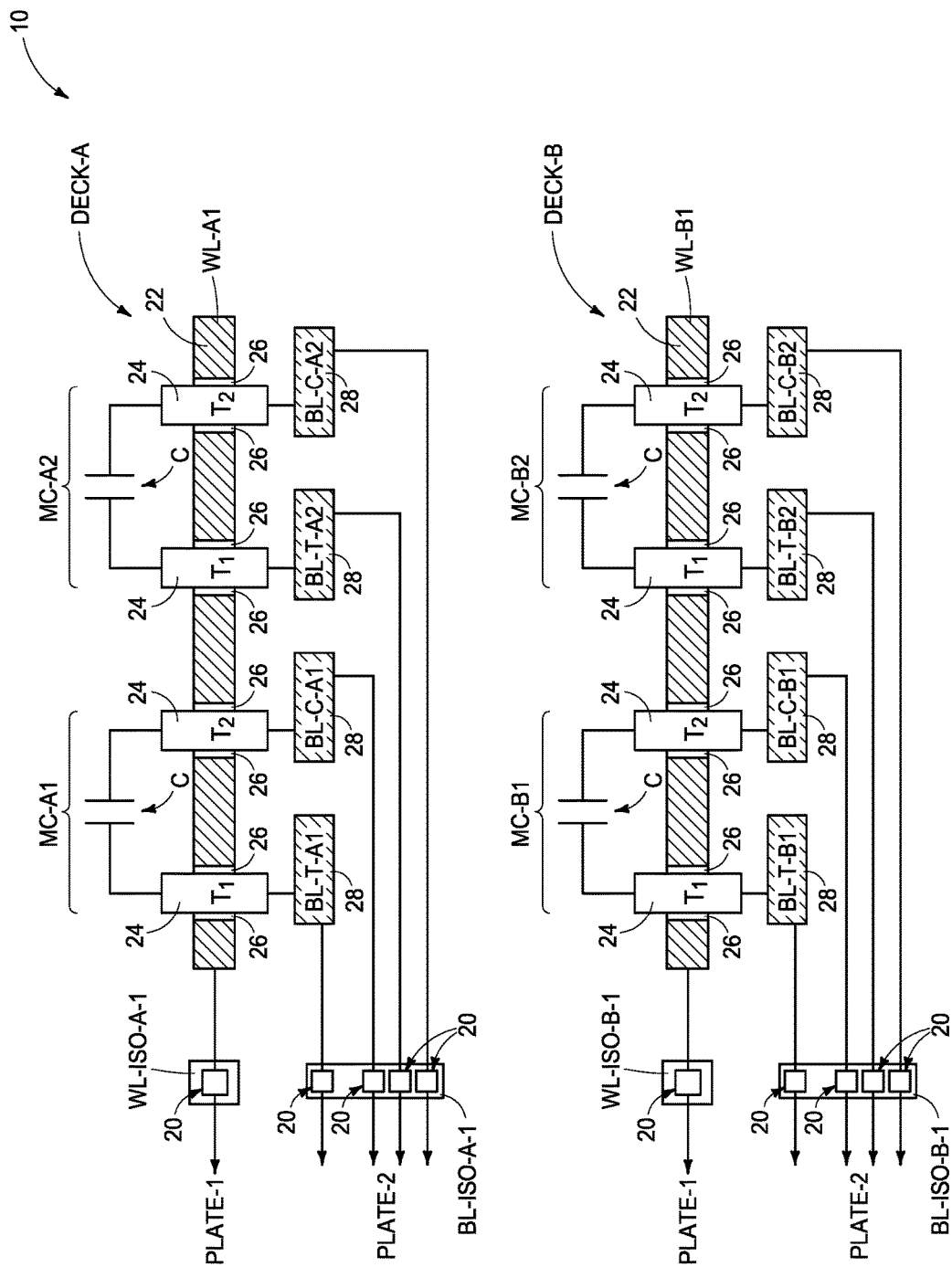

FIG. 11 shows portions of the integrated memory assembly 10 of FIG. 7. FIG. 11 specifically shows the wordlines WL-A1 and WL-B1 extending to the controlled-voltage plate, PLATE-1, through the wordline isolation circuitries WL-ISO-A-1 and WL-ISO-B-1, respectively; and shows the bitlines BL-T-A1, BL-C-A1, BL-T-A2, BL-C-A2, BL-T-B1, BL-C-B1, BL-T-B2 and BL-C-B2 extending to the controlled-voltage plate, PLATE-2, through the bitline isolation circuitries BL-ISO-A-1 and BL-ISO-B-1.

Figure 12:
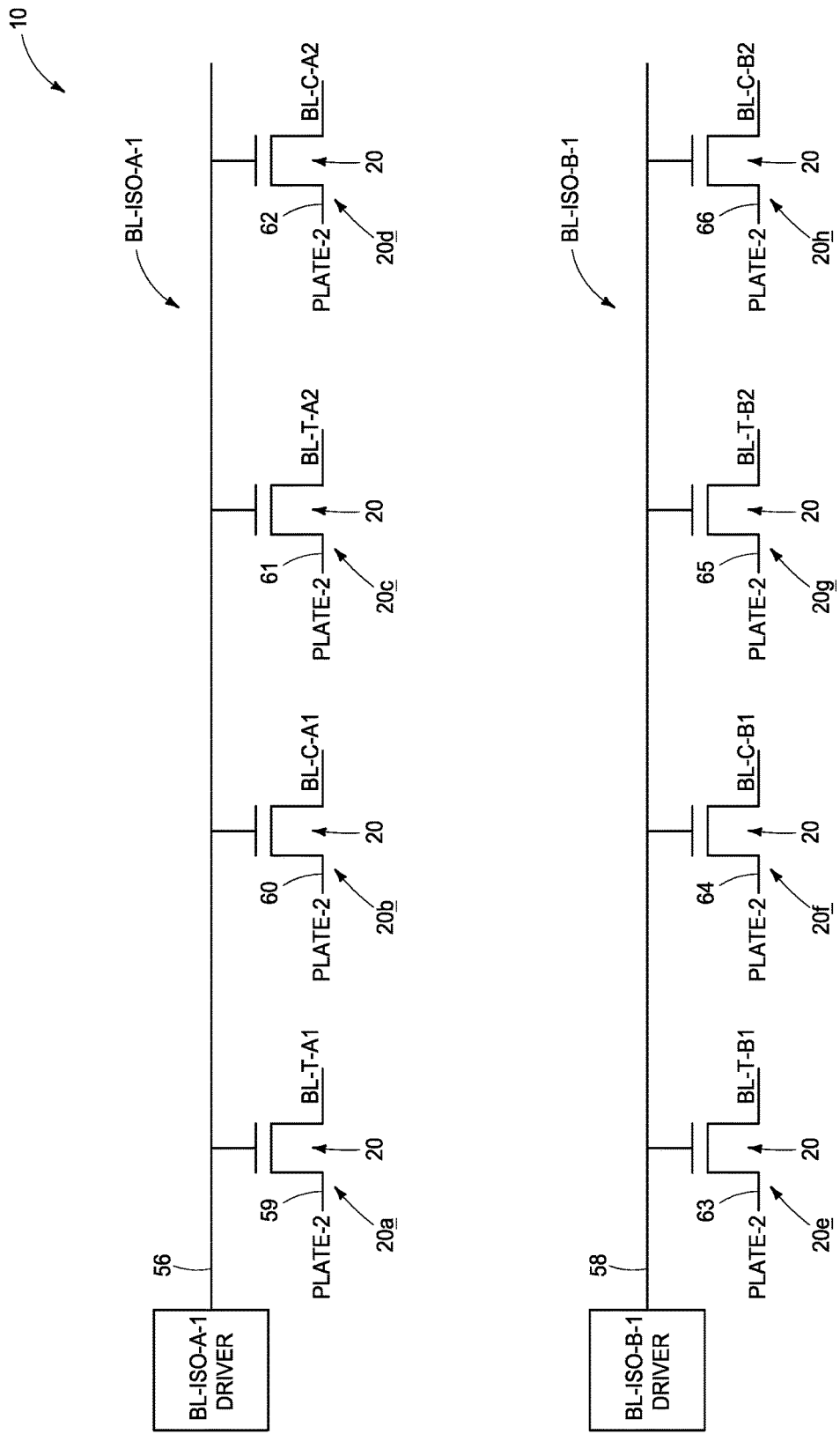

FIG. 12 schematically illustrates regions of the bitline isolation circuitries BL-ISO-A-1 and BL-ISO-B-1 of FIGS. 7 and 11. The BL-ISO-A-1 circuitry includes a conductive line 56 that extends from the BL-ISO-A-1 DRIVER and which is electrically coupled with the gates of a first series of the transistors 20; and the BL-ISO-B-1 circuitry includes a conductive line 58 that extends from the BL-ISO-B-1 DRIVER and which is electrically coupled with the gates of a second series of the transistors 20.

In some embodiments, the illustrated transistors 20 of the BL-ISO-A-1 circuitry may be referred to as a first transistor 20*a*, a second transistor 20*b*, a third transistor 20*c* and a fourth transistor 20*d*; and the illustrated transistors 20 of the BL-ISO-B-1 circuitry may be referred to as a fifth transistor 20*e*, a sixth transistor 20*f*, a seventh transistor 20*g* and an eighth transistor 20*h*.

The bitlines BL-T-A1, BL-C-A1, BL-T-A2 and BL-C-A2 may be considered to extend through the isolation circuitry BL-ISO-A-1 to PLATE-2. The first transistor 20*a* gatedly connects BL-T-A1 with a first conductive route 59 to PLATE-2; the second transistor 20*b* gatedly connects BL-C-A1 with a second conductive route 60 to PLATE-2; the third transistor 20*c* gatedly connects BL-T-A2 with a third conductive route 61 to PLATE-2; and the fourth transistor 20*d* gatedly connects BL-C-A2 with a fourth conductive route 62 to PLATE-2.

The bitlines BL-T-B1, BL-C-B1, BL-T-B2 and BL-C-B2 may be considered to extend through the isolation circuitry BL-ISO-B-1 to PLATE-2. The fifth transistor 20*e* gatedly connects BL-T-B1 with a fifth conductive route 63 to PLATE-2; the sixth transistor 20*f* gatedly connects BL-C-B1 with a sixth conductive route 64 to PLATE-2; the seventh transistor 20*g* gatedly connects BL-T-B2 with a seventh conductive route 65 to PLATE-2; and the eighth transistor 20*h* gatedly connects BL-C-B2 with an eighth conductive route 66 to PLATE-2.

In some embodiments, the bitline isolation circuitries BL-ISO-A-1 and BL-ISO-B-1 may be referred to as third and fourth isolation circuitries to distinguish them from the first and second bitline isolation circuitries BL-ISO-A and BL-ISO-B. In such embodiments, the transistors 20*a-h* of FIG. 12 may be referred to as ninth, tenth, eleventh, twelfth, thirteenth, fourteenth, fifteenth, and sixteenth transistors, respectively, to distinguish them from the first eight transistors of the BL-ISO-A and BL-ISO-B circuitries (shown in FIG. 9); and the conductive routes 59-66 may be referred to as ninth through sixteenth conductive routes.

Figure 13:
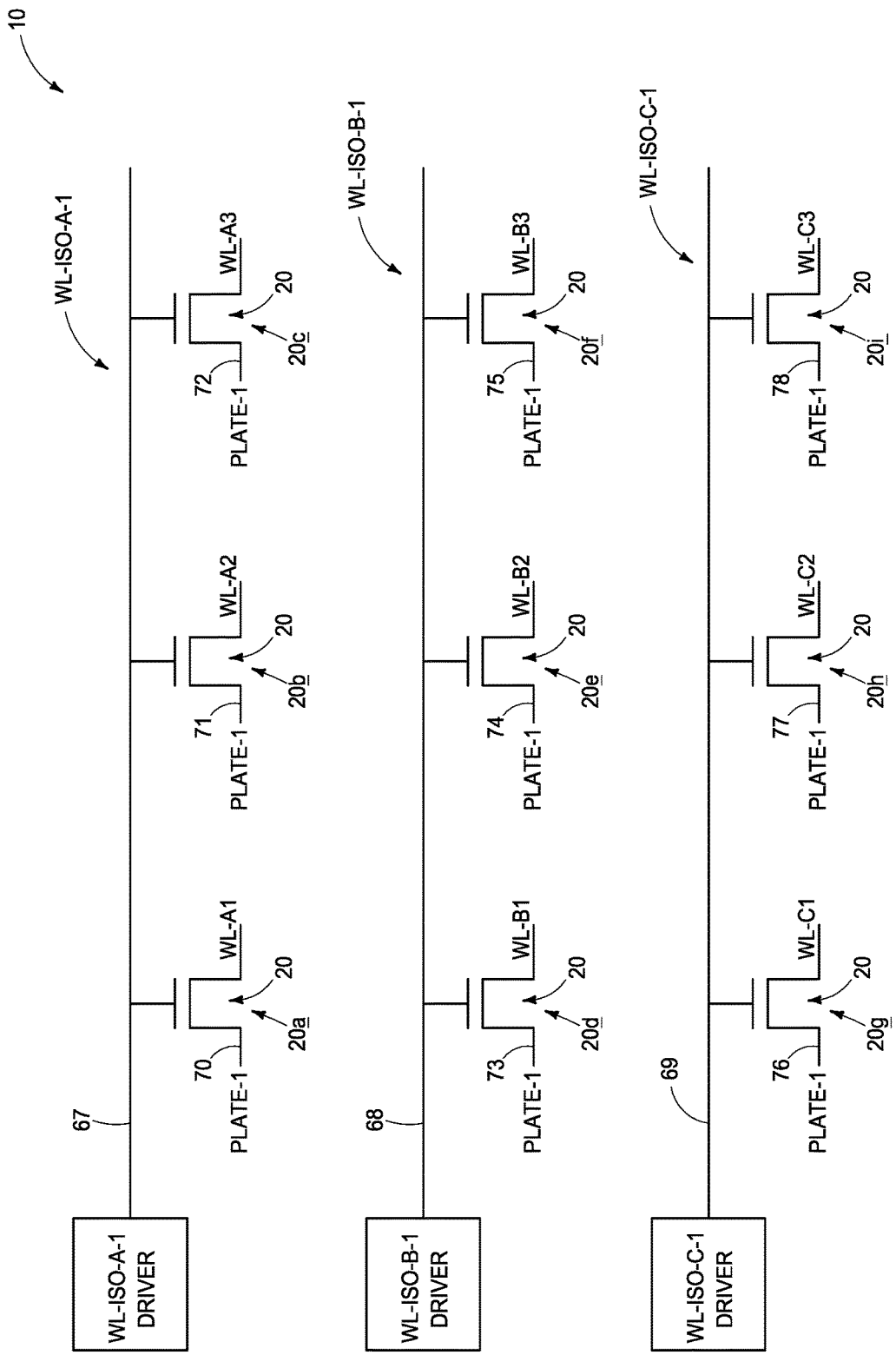

FIG. 13 schematically illustrates regions of the wordline isolation circuitries WL-ISO-A-1, WL-ISO-B-1 and WL-ISO-C-1 of FIGS. 7 and 11. The WL-ISO-A-1 circuitry includes a conductive line 67 that extends from the WL-ISO-A-1 DRIVER and which is electrically coupled with the gates of a first series of the transistors 20; the WL-ISO-B-1 circuitry includes a conductive line 68 that extends from the WL-ISO-B-1 DRIVER and which is electrically coupled with the gates of a second series of the transistors 20; and the WL-ISO-C-1 circuitry includes a conductive line 69 that extends from the WL-ISO-C-1 DRIVER and which is electrically coupled with the gates of a third series of the transistors 20.

In some embodiments, the illustrated transistors 20 of the WL-ISO-A-1, WL-ISO-B-1 and WL-ISO-C-1 circuitries may be referred to as first-ninth transistors 20*a-i*, respectively. The wordlines WL-A1, WL-A2 and WL-A3 may be considered to extend through the first isolation circuitry WL-ISO-A-1 to PLATE-1; the wordlines WL-B1, WL-B2 and WL-B3 may be considered to extend through the second isolation circuitry WL-ISO-B-1 to PLATE-1; and the wordlines WL-C1, WL-C2 and WL-C3 may be considered to extend through the third isolation circuitry WL-ISO-C-1 to PLATE-1.

The first transistor 20*a* gatedly connects WL-A1 with a first conductive route 70 to PLATE-1; the second transistor 20*b* gatedly connects WL-A2 with a second conductive route 71 to PLATE-1; and the third transistor 20*c* gatedly connects WL-A3 with a third conductive route 72 to PLATE-1. The fourth transistor 20*d* gatedly connects WL-B1 with a fourth conductive route 73 to PLATE-1; the fifth transistor 20*e* gatedly connects WL-B2 with a fifth conductive route 74 to PLATE-1; and the sixth transistor 20*f* gatedly connects WL-B3 with a sixth conductive route 75 to PLATE-1. The seventh transistor 20*g* gatedly connects WL-C1 with a seventh conductive route 76 to PLATE-1; the eighth transistor 20*h* gatedly connects WL-C2 with an eighth conductive route 77 to PLATE-1; and the ninth transistor 20*i* gatedly connects WL-C3 with a ninth conductive route 78 to PLATE-1.

In some embodiments, the wordline isolation circuitries WL-ISO-A-1, WL-ISO-B-1 and WL-ISO-C-1 may be referred to as fourth through sixth isolation circuitries to distinguish them from the first through third wordline isolation circuitries WL-ISO-A, WL-ISO-B and WL-ISO-C (FIG. 10). In such embodiments, the transistors 20*a-i* of FIG. 13 may be referred to as tenth through eighteenth transistors, respectively, to distinguish them from the first nine transistors of the WL-ISO-A, WL-ISO-B and WL-ISO-C circuitries (shown in FIG. 10); and the conductive routes 70-78 may be referred to as tenth through eighteenth conductive routes, respectively, to distinguish them from the first nine conductive routes of the WL-ISO-A, WL-ISO-B and WL-ISO-C circuitries (shown in FIG. 10).

In some embodiments, only some of the transistors of FIGS. 10 and 13 are referred to in a particular claim or description, and accordingly the numbering of the transistors may vary relative to the descriptions in FIGS. 10 and 13. For instance, if four transistors are described in a claim set as being associated with the wordline isolation circuitries WL-ISO-A and WL-ISO-B (shown in FIG. 10), and if four more transistors are described in the claim set as being associated with the wordline isolation circuitries WL-ISO-A-1 and WL-ISO-B-1 (shown in FIG. 13); then the four transistors associated with wordline isolation circuitries WL-ISO-A and WL-ISO-B may be referred to as the first through fourth transistors, and the four transistors associated with wordline isolation circuitries WL-ISO-A-1 and WL-ISO-B-1 may be referred to as the fifth through eighth transistors. Also, the four conductive routes associated with wordline isolation circuitries WL-ISO-A and WL-ISO-B may be referred to as the first through fourth conductive routes, and the four conductive routes associated with wordline isolation circuitries WL-ISO-A-1 and WL-ISO-B-1 may be referred to as the fifth through eighth conductive routes.

Figure 14:
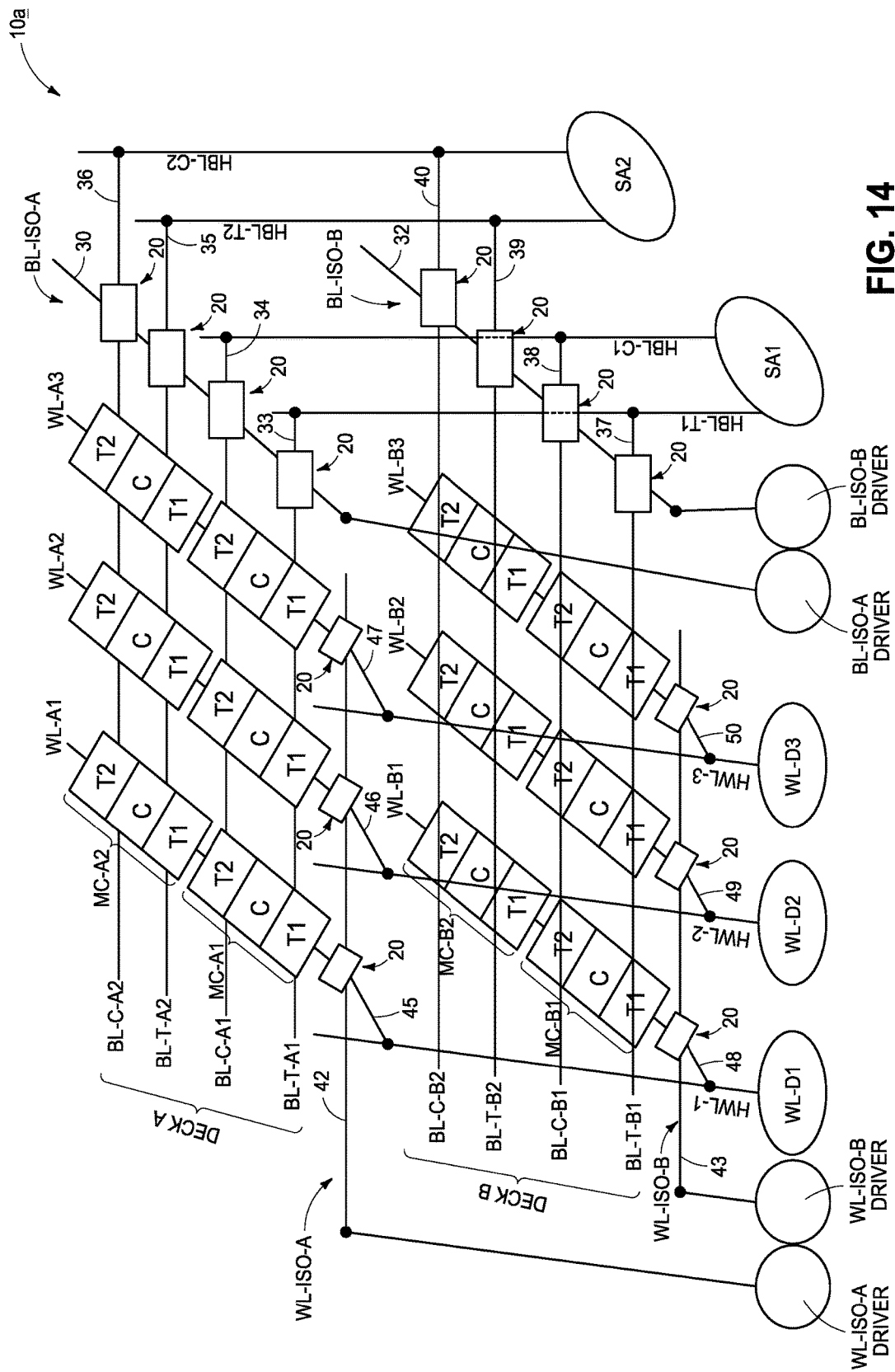
FIG. 14 is a schematic diagram of an example integrated memory assembly having multiple memory array decks.

FIG. 7 is a diagrammatic view of an example integrated memory assembly 10 having a generic stack of memory array decks (DECKs A-C). FIG. 14 shows another example integrated memory assembly 10a, with such memory array having memory array decks (DECKs A and B) which specifically comprise 2T-1C memory cells. Each memory cell comprises a first transistor T1, a second transistor T2 and a capacitor C. Two memory cells of DECK A are specifically identified as memory cells MC-A1 and MC-A2, and two memory cells of DECK B are specifically identified as memory cells MC-B1 and MC-B2. The controlled-voltage plates (PLATE-1 and PLATE-2) of FIG. 7 are not shown in FIG. 14, but such plates (together with appropriate isolation circuitry analogous to the circuitries WL-ISO-A-1, BL-ISO-A-1, etc. described with reference to FIG. 7) may be included in some embodiments.

The various components and structures of FIG. 14 are labeled with analogous numbering and symbols as are utilized above in describing FIGS. 7-13. The illustration of FIG. 14 illustrates the relationships of the bitlines (BL-T-A1, BL-C-A1, BL-T-A2, BL-C-A2, BL-T-B1, BL-C-B1, BL-T-B2 and BL-C-B2) and wordlines (WL-A1, WL-A2, WL-A3, WL-B1, WL-B2 and WL-B3) to the 2T-1C memory cells (e.g. memory cells MC-A1, MC-A2, MC-B1 and MC-B2). FIG. 14 also shows the conductive lines 30 and 32 extending from the bitline isolation drivers (BL-ISO-A DRIVER and BL-ISO-B DRIVER), as well as the conductive lines 42 and 43 extending from the wordline isolation drivers (WL-ISO-A DRIVER and WL-ISO-B DRIVER). The conductive lines 30, 32, 42 and 43 electrically couple with gates of transistors 20 as described above with reference to FIGS. 9 and 10. FIG. 14 shows conductive routes 33-40 (described above with reference to FIG. 9) extending from the transistors 20 to the hierarchical bitline paths (HBL-T1, HBL-C1, HBL-T2 and HBL-C2), and also shows conductive routes 45-50 (discussed above with reference to FIG. 10) from the transistors 20 to the hierarchical wordline paths (HWL-1, HWL-2, and HWL-3). A couple regions of the hierarchical bitline paths HBL-T1 and HBL-C1 are shown in dashed line to indicate that such regions pass across a pair of the illustrated transistors 20, but do not pass through the illustrated transistors.

Figure 15:
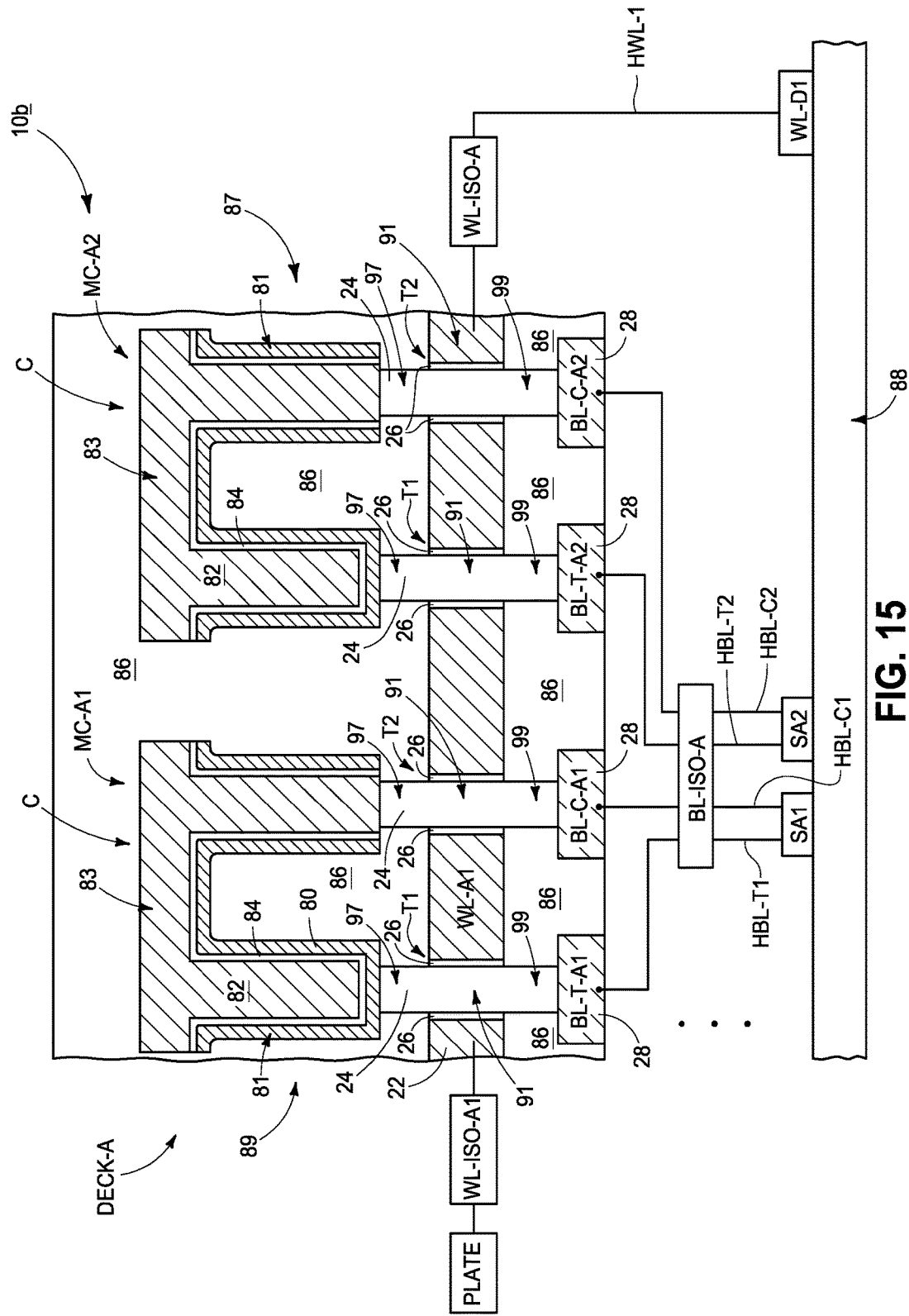
FIGS. 15-24 are diagrammatic cross-sectional views of example integrated memory assemblies having multiple memory array decks.

FIG. 15 shows a region of another example integrated memory assembly 10b. Such region includes a portion of a memory array deck (DECK-A) having memory cells (MC-A1 and MC-A2). Other memory array decks (e.g., one or both of DECKs B and C of FIG. 7) are present with DECK-A in a stacked assembly of memory array decks, but the other memory array decks are not shown in FIG. 15 in order to simplify the drawing.

The memory cells MC-A1 and MC-A2 are 2T-1C memory cells, and comprise the first and second transistors T1 and T2 together with the capacitors C.

The first and second transistors T1 and T2 comprise semiconductor material 24 extending through conductive material 22 of a wordline WL-A1, similar to the transistor constructions described above with reference to FIG. 8. Dielectric material 26 is between the semiconductor material 24 of the transistors T1 and T2, and the conductive material 22 of wordline WL-A1. Although it appears that the wordline WL-A1 is broken by the materials 24 and 26 of transistors T1 and T2 in the cross-sectional view of FIG. 15, in practice the conductive material 22 extends around the materials 24 and 26 in regions outside of the illustrated plane of FIG. 15.

The transistors T1 and T2 comprise gated channel regions 91 within semiconductor material 24, and comprise source/drain regions 97 and 99 on opposing sides of the channel regions 91. The channel regions 91 extend vertically through the conductive material 22 of the wordline WL-A1.

The capacitors C comprise first conductive material 80 corresponding to first capacitor nodes 81, second conductive material 82 corresponding to second capacitor nodes 83, and capacitor dielectric 84 between the first and second conductive materials 80 and 82. The first capacitor nodes 81 are electrically coupled with the transistors T1 of the memory cells MC-A1 and MC-A2; and the second capacitor nodes 83 are electrically coupled with the transistors T2 of the memory cells.

The first and second conductive materials 80 and 82 may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive materials 80 and 82 may be the same composition as one another in some embodiments, and may comprise different compositions relative to one another in other embodiments.

The capacitor dielectric material 84 may comprise any suitable composition or combination of compositions; such as, for example, one or more of silicon dioxide, silicon nitride, etc.

Insulative material 86 extends over and between the capacitors C, as well is under the wordline WL-A1. The insulative material 86 may comprise any suitable composition or combination of compositions, including, for example, one or more of silicon dioxide, silicon nitride, etc.

The DECK-A is shown to be supported by a base 88. The base 88 may comprise semiconductor material; and may, for example, comprise, consist essentially of, or consist of monocrystalline silicon. The base 88 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 88 may correspond to a semiconductor substrate containing one or more materials associated with integrated circuit fabrication. Such materials may include, for example, one or more of refractory metal materials, barrier materials, diffusion materials, insulator materials, etc.

The base 88 is shown to be spaced from DECK-A by a gap to indicate that additional structures or materials may be provided between DECK-A and base 88. Such additional structures and materials may include, for example, other memory array decks of a stacked memory assembly.

The wordline WL-A1 is shown extending to the wordline isolation circuitry WL-ISO-A on one side of the DECK-A (which may be referred to as a first side 87 of the memory array comprised by DECK-A), and extending to the wordline isolation circuitry WL-ISO-A-1 on another side of the DECK-A (which may be referred to as a second side 89 of the memory array comprised by DECK-A). In the shown embodiment, the first and second sides 87 and 89 are in opposing relation to one another; with the memory array of DECK-A extending between the first and second sides 87 and 89.

The wordline isolation circuitry WL-ISO-A-1 couples the wordline WL-A1 with the controlled-voltage plate (PLATE-1), and the wordline isolation circuitry WL-ISO-A couples the wordline WL-A1 with the conductive path HWL-1 extending to the wordline driver WL-D1. In the shown embodiment, the wordline driver WL-D1 is supported by the base 88, and is below stacked memory array decks (e.g., the shown DECK-A and other decks which are not shown; and which may include, for example, DECKs B and C of FIG. 7). The wordline driver WL-D1 may be directly below the stacked memory array decks, or may be laterally offset from being directly below the stacked memory array decks. Although the wordline driver WL-D1 is shown to be below the stacked memory array decks, in other embodiments the wordline driver WL-D1 may be in other locations, such as laterally offset from the decks and along the sides of the decks, above the decks, etc. In other embodiments, further, the wordline driver WL-D1 may be formed in the base 88. The wordline driver WL-D1 is an example of numerous wordline drivers that may be utilized with stacked memory array decks (for instance, the wordline drivers WL-D2 and WL-D3 of FIG. 7 may also be utilized), and all of such wordline drivers may be in a similar location relative to the stacked memory array decks (e.g., below the stacked memory array decks, beside the stacked memory array decks, over the stacked memory array decks, etc.).

The controlled-voltage plate (PLATE-1) is shown to be beside the stacked memory array decks, but in other embodiments may be in other locations; such as, for example, below the stacked memory array decks (e.g., supported on base 88 beside the wordline drivers), above the stacked memory array decks, etc.

Bitlines BL-T-A1, BL-C-A1, BL-T-A2 and BL-C-A2 are electrically coupled with source/drain regions of the transistors T1 and T2. The bitlines extend to bitline isolation circuitry (BL-ISO-A) which couples the bitlines with the conductive paths HBL-T1, HBL-C1, HBL-T2 and HBL-C2 extending to the sense amplifiers SA1 and SA2. In the shown embodiment, the sense amplifiers SA1 and SA2 are supported by the base 88, and are below stacked memory array decks (e.g., the shown DECK-A and other decks which are not shown, which may include, for example, DECKs B and C of FIG. 7). The sense amplifiers SA1 and SA2 may be directly below the stacked memory array decks, or may be laterally offset from being directly below the stacked memory array decks. Although the sense amplifiers SA1 and SA2 are shown to be below the stacked memory array decks, in other embodiments the sense amplifiers SA1 and SA2 may be in other locations, such as laterally offset from the decks and along the sides of the decks, above the decks, etc. In other embodiments, further, the sense amplifiers SA1 and SA2 may be formed in the base 88. The sense amplifiers SA1 and SA2 are examples of numerous sense amplifiers that may be utilized with stacked memory array decks, and all of such sense amplifiers may be in a similar location relative to the stacked memory array decks (e.g., below the stacked memory array decks, beside the stacked memory array decks, over the stacked memory array decks, etc.).

Although not shown in FIG. 15, the bitlines BL-T-A1, BL-C-A1, BL-T-A2 and BL-C-A2 may also extend to bitline isolation circuitry (BL-ISO-A-1) which couples the bitlines with the controlled-voltage plate (PLATE-2 of FIG. 7). PLATE-2 may be beside the stacked memory array decks, below the stacked memory array decks (e.g., supported on base 88 beside the wordline drivers), above the stacked memory array decks, etc. In some embodiments, PLATE-1 and PLATE-2 may be both comprised by a single continuous plate, rather than being separate plates.

The various isolation circuitries (e.g., BL-ISO-A, BL-ISO-A-1, WL-ISO-A, WL-ISO-A-1, etc.) may be in any suitable locations relative to the stacked memory array decks; including, for example, laterally beside the stacked memory array decks, above the stacked memory array decks, below the stacked memory array decks, etc.

Figure 16:
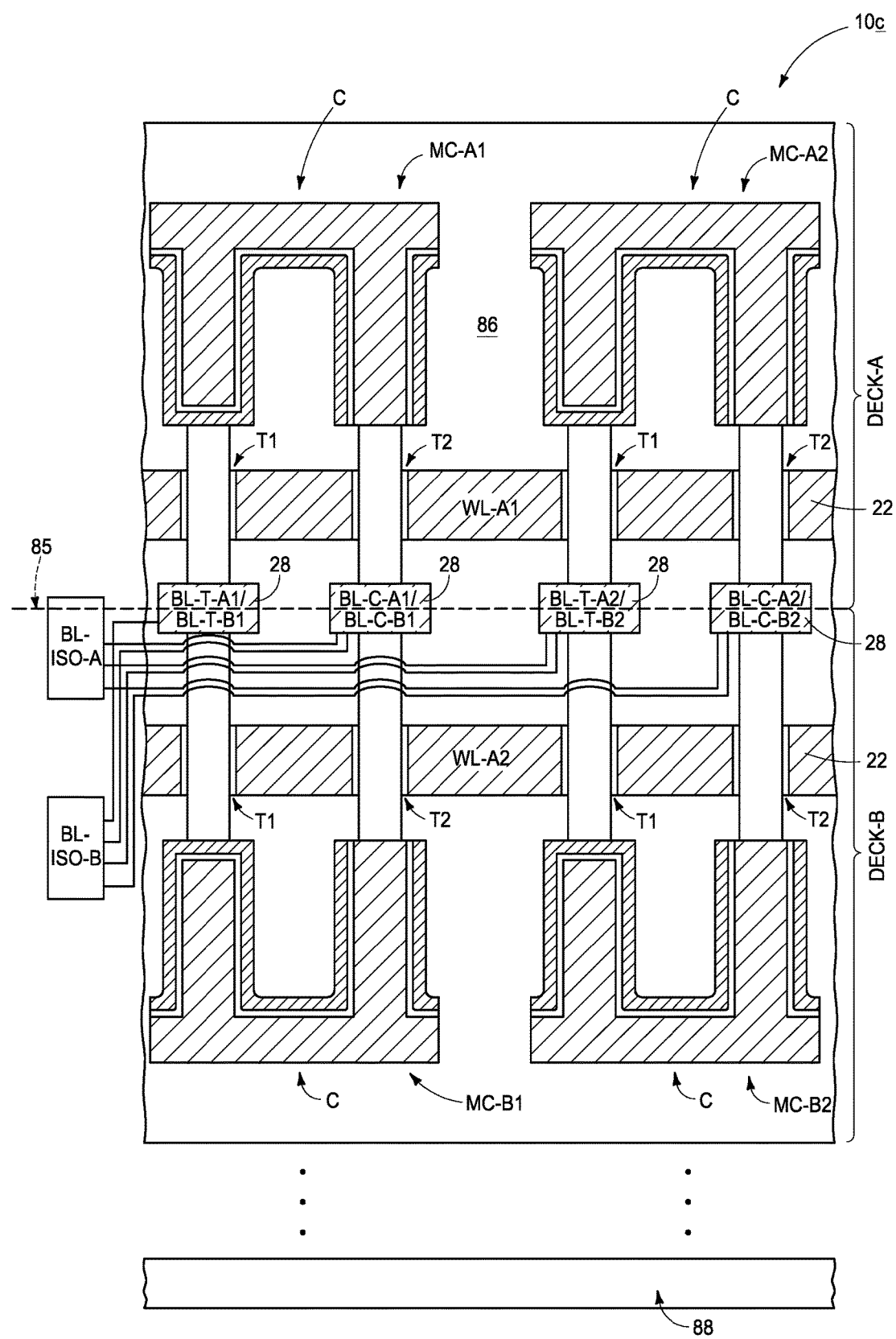

FIG. 16 shows a region of an example integrated memory assembly 10c comprising memory cells MC-A1 and MC-A2 of a DECK-A shown in FIG. 15, in combination with analogous memory cells MC-B1 and MC-B2 of a DECK-B. In the illustrated assembly, the DECKs A and B are mirrored across a central plane 85 between them, and share bitlines (illustrated as BL-T-A1/BL-T-B1, BL-C-A1/BL-C-B1, BL-T-A2/BL-T-B2 and BL-C-A2/BL-C-B2). The bitlines are electrically coupled to the bitline isolation circuitries BL-ISO-A and BL-ISO-B; and may extend through such bitline isolation circuitries to the conductive paths HBL-T1, HBL-C1, HBL-T2 and HBL-C2 (not shown in FIG. 16). Additional example embodiments utilizing the configuration of FIG. 16 are described below with reference to FIGS. 22 and 23.

Wordline isolation circuitries (e.g., WL-ISO-A and WL-ISO-A-1) are not shown in FIG. 16 in order to simplify the drawing, but may be included in some applications. Also, the controlled-voltage plates (PLATE-1 and PLATE-2) are not shown in FIG. 16 in order to simplify the drawing, but may be included in some applications.

Figure 17:
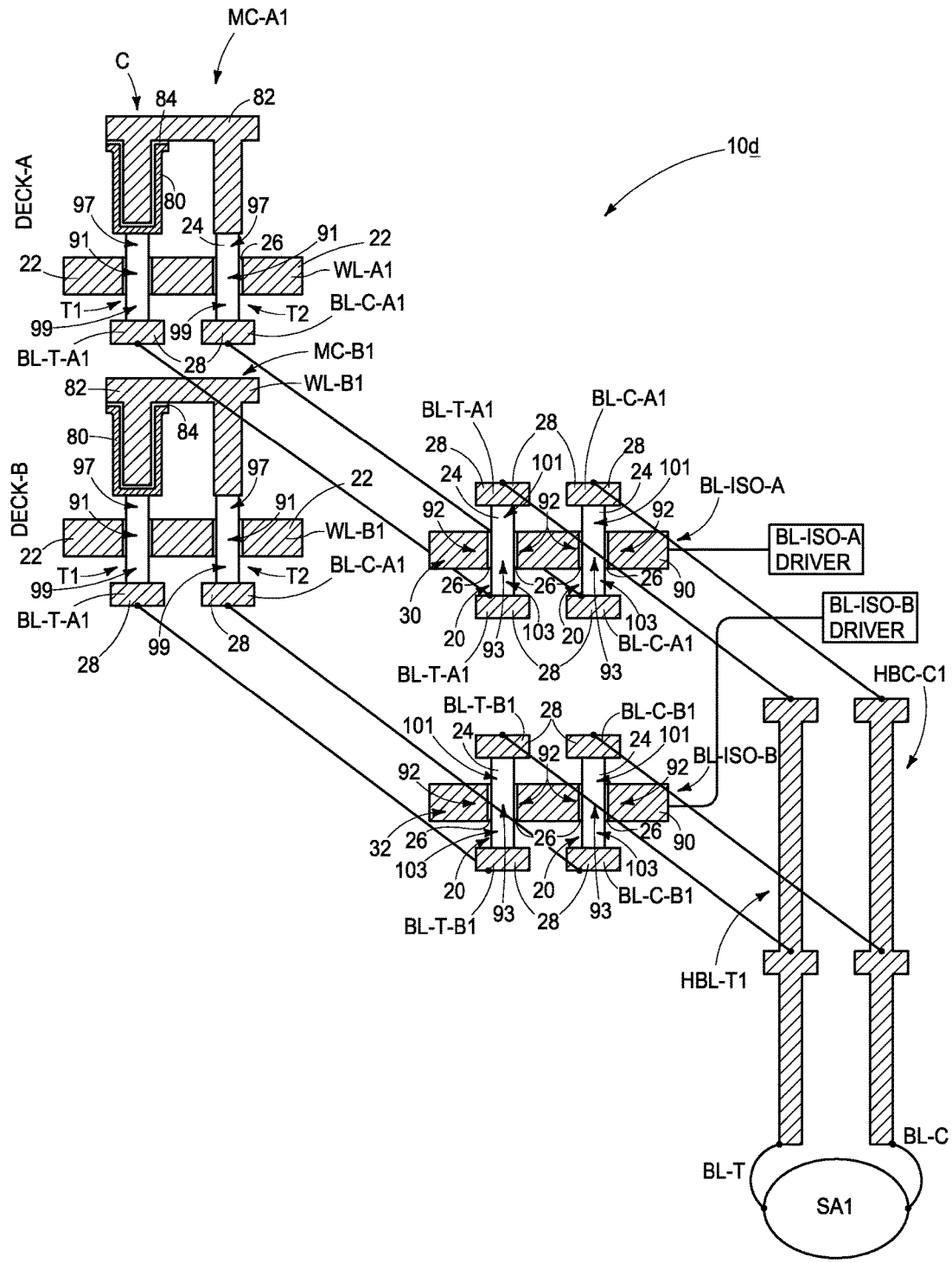

FIG. 17 shows a region of another example integrated memory assembly 10d. Such region includes a portion of the memory array DECK-A having the 2T-1C memory cell MC-A1, and includes a portion of the memory array DECK-B having the 2T-1C memory cell MC-B1. The conductive lines 30 and 32 of the bitline isolation circuitries BL-ISO-A and BL-ISO-B are shown to comprise conductive material 90. The conductive material 90 may comprise any suitable composition or combination of compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive material 90 of the bitline isolation circuitries BL-ISO-A and BL-ISO-B may be the same composition as the conductive material 22 of the wordlines and/or the same composition as the conductive material 28 of the bitlines in some embodiments, and may be a different composition than one or both of the conductive materials 22 and 28 in other embodiments.

In the embodiment of FIG. 17, the memory arrays of DECKs A and B extend substantially horizontally (with the term "substantially horizontally" meaning horizontal to within reasonable tolerances of fabrication and measurement), and the conductive material 90 of the conductive lines 30 and 32 also extends substantially horizontally.

The transistors 20 of the bitline isolation circuitries (BL-ISO-A and BL-ISO-B) comprise semiconductor material 24 extending through the conductive material 90, comprise gates 92 within the conductive material 90, and comprise channel regions 93 within the semiconductor material 24 and along the gates 92. In the illustrated embodiment, the channel regions 93 extend substantially vertically through the conductive material 90 of the lines 30 and 32. Source/drain regions 101 and 103 are on opposing sides of the channel regions 93.

In some embodiments, the conductive lines 30 and 32 of bitline isolation circuitries BL-ISO-A and BL-ISO-B may be referred to as first and second conductive lines, respectively; and the conductive material 90 within the first conductive line 30 may be referred to as first conductive material, while the conductive material 90 within the second conductive line 32 is referred to as second conductive material. The first conductive material within the first conductive line 30 is coupled with a first isolation driver (BL-ISO-A DRIVER), and the second conductive material within the second conductive line 32 is coupled with a second isolation driver (BL-ISO-B DRIVER).

The isolation circuitries BL-ISO-A and BL-ISO-B are vertically stacked one atop another in the shown embodiment, but may be provided in other arrangements in other embodiments.

FIG. 17 may be considered to show a portion of an example embodiment of the FIG. 7 structure. The illustrated portion shows circuitry associated with transferring electrical signals between comparative bitlines (BL-T-A1, BL-C-A1, BL-T-B1 and BL-C-B1) of a couple of stacked memory cells (MC-A1 and MC-B1) and the first sense amplifier (SA1). Additional structures may be provided to include other memory array decks, other memory cells, other sense amplifiers, other wordlines, etc. The memory cells of FIG. 17 are shown to be in 2T-1C configurations, but in other embodiments may be in any other suitable configurations; including, for example 2T-2C configurations, 3T-1C configurations, etc.

Figure 18:
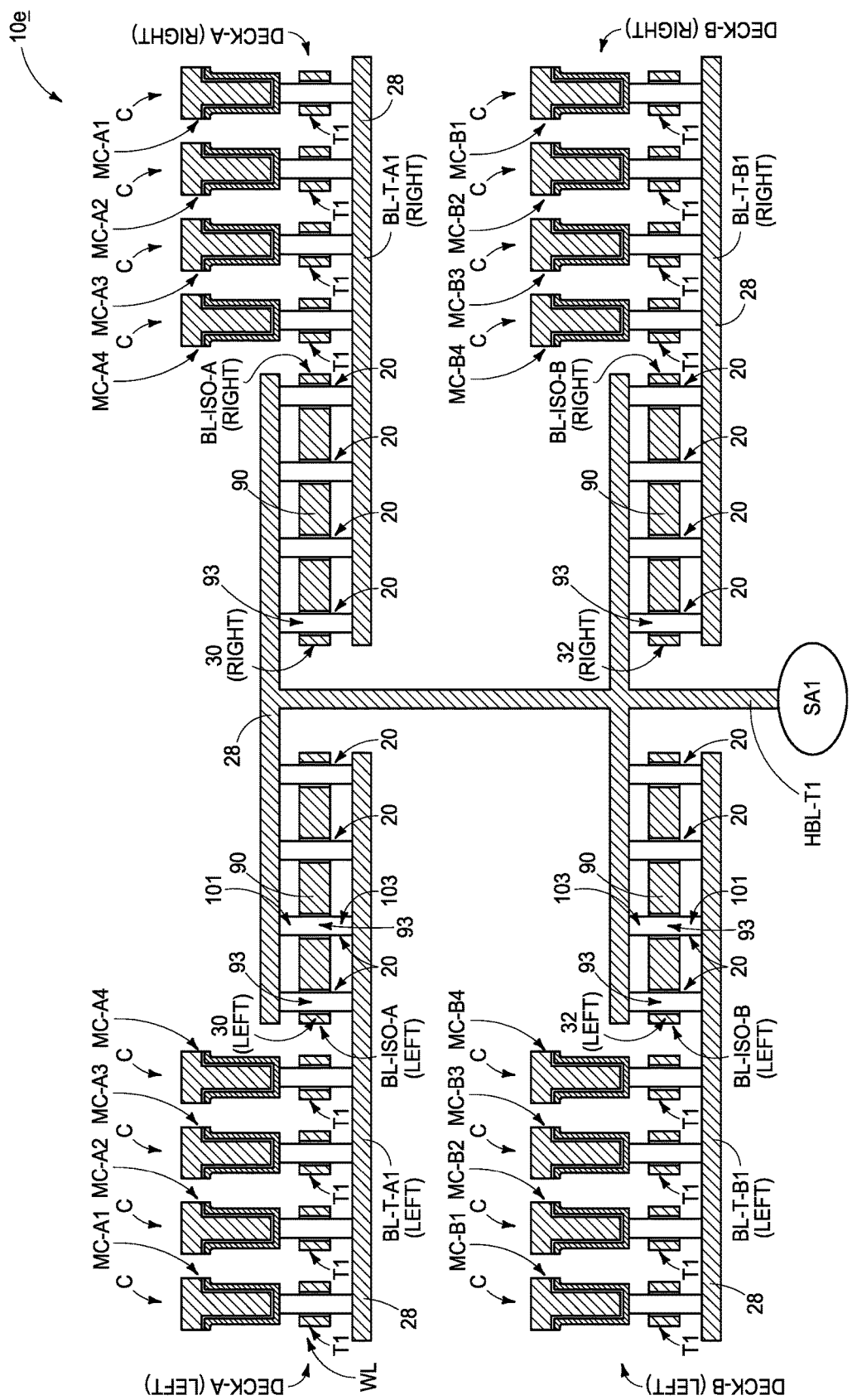

FIG. 18 shows another example integrated memory assembly 10e, with such assembly having stacked memory array decks (DECK-A and DECK-B). Each of the stacked memory array decks has an array on the left side of a hierarchical bitline path (HBL-T1) and an array on the right side of the hierarchical bitline path (HBL-T1); with the arrays on the left side being labeled as DECK-A (LEFT) and DECK-B (LEFT), and the arrays on the right side being labeled as DECK-A (RIGHT) and DECK-B (RIGHT). Each of the arrays includes multiple memory cells (e.g., MC-A(1-4) and MC-B(1-4)).

Comparative bitlines (BL-T-A1 (LEFT), BL-T-A1 (RIGHT), BL-T-B1 (LEFT) and BL-T-B1 (RIGHT)) extend across the arrays to bitline isolation circuitry (BL-ISO-A (LEFT), BL-ISO-A (RIGHT), BL-ISO-B (LEFT) and BL-ISO-B (RIGHT)) of the type described above with reference to FIG. 9. Notably, each bitline isolation circuitry (BL-ISO-A (LEFT), BL-ISO-A (RIGHT), BL-ISO-B (LEFT) and BL-ISO-B (RIGHT)) includes a series of transistors 20 in parallel, with the number of transistors being balanced with the number of memory cells on an attached bitline (e.g., line BL-T-A1 (LEFT) is shown to have 4 memory cells (MC-A(1-4)), and the isolation circuitry BL-ISO-A (LEFT) has four transistors 20).

In some applications, each of the bitline isolation circuitries (BL-ISO-A (LEFT), BL-ISO-A (RIGHT), BL-ISO-B (LEFT) and BL-ISO-B (RIGHT)) may be considered to include a multiplexer (mux).

The transistors 20 of FIG. 18 are similar to the transistors 20 of FIG. 17, and include channel regions 93 (only some of which are labeled in FIG. 18) extending substantially vertically through the conductive material 90 of the lines 30 (LEFT and RIGHT) and 32 (LEFT and RIGHT); with the channel regions 93 being between source/drain regions 101 and 103 (only some of which are labeled in FIG. 18).

The memory cells (e.g., MC-A(1-4)) are shown to comprise capacitors C coupled with transistors T1. The transistors may be along wordlines WL (only one of which is labeled) which comprise gates of the transistors.

FIG. 18 may be considered to show a portion of an example embodiment of the FIG. 7 structure. The illustrated portion shows circuitry associated with transferring electrical signals between comparative bitlines (BL-T-A1 (LEFT), BL-T-A1 (RIGHT), BL-T-B1 (LEFT) and BL-T-B1 (RIGHT)) and the first sense amplifier (SA1). Additional structures may be provided to include other bitlines (e.g., the BL-C bitlines), other memory cells, other sense amplifiers, other wordlines, other memory array decks, etc. Additionally, controlled-voltage plates (e.g., PLATE-1 and PLATE-2 of FIG. 7) may be provided together with appropriate circuitry. The memory cells (e.g., MC-A(1-4)) of FIG. 18 may be in any suitable configurations, including, for example 2T-1C configurations, 2T-2C configurations, 3T-1C configurations, etc.

Figure 19:
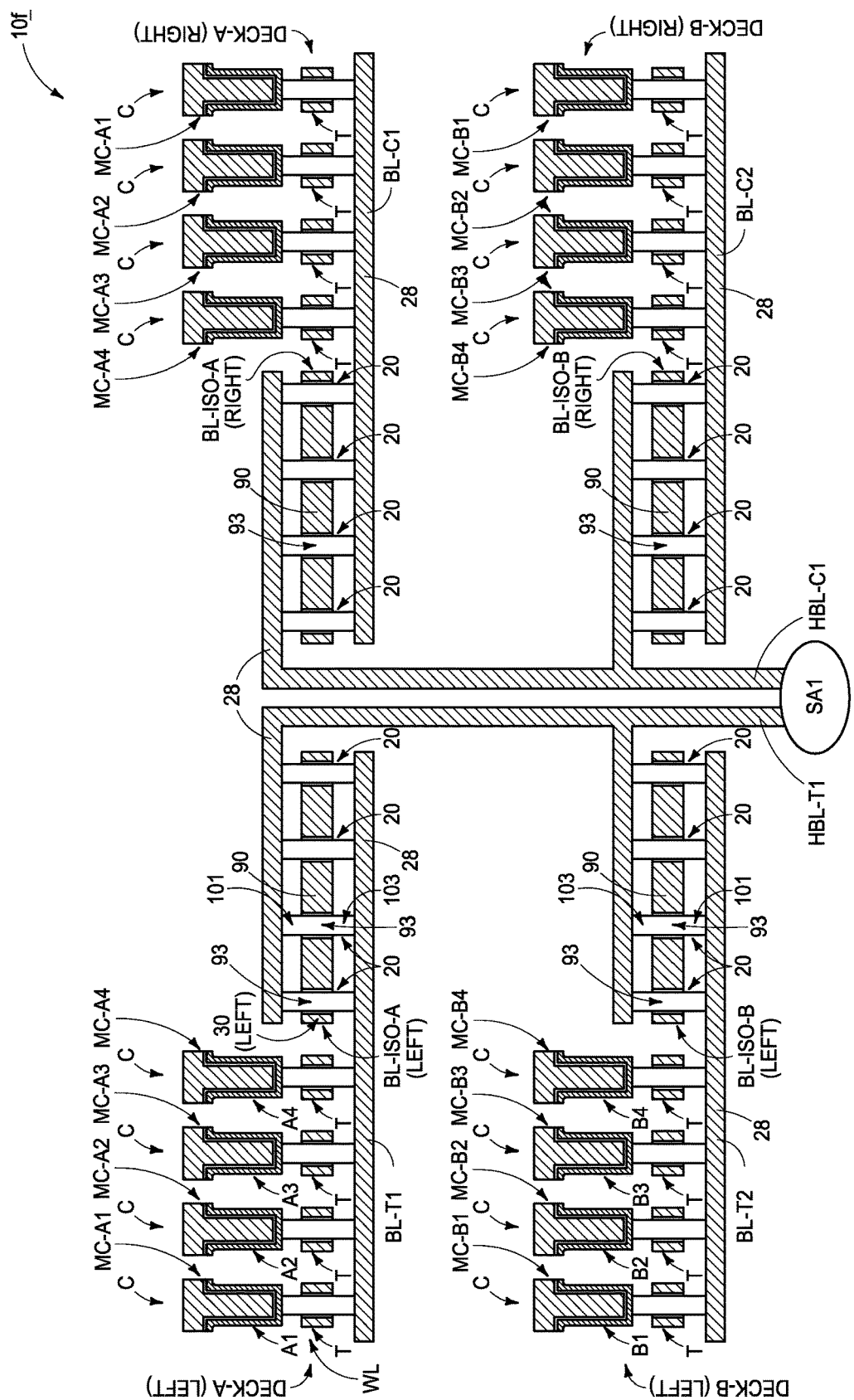

FIG. 19 shows another example integrated memory assembly 10f, with such assembly having stacked memory array decks (DECK-A and DECK-B) of a DRAM architecture with an open bitline arrangement. Each of the stacked decks has an array on the left with a comparative bitline (BL-T1, BL-T2) which is coupled with a hierarchical bitline path (HBL-T1), and has an array on the right with a comparative bitline (BL-C1, BL-C2) which is coupled with a hierarchical bitline path (HBL-C1). The arrays on the left side are labeled as DECK-A (LEFT) and DECK-B (LEFT), and the arrays on the right side are labeled as DECK-A (RIGHT) and DECK-B (RIGHT). Each of the arrays includes multiple memory cells (e.g., MC-A(1-4) and MC-B (1-4)).

The paths HBL-T1 and HBL-C1 extend to a sense amplifier SA1.

Each of the comparative bitlines (BL-T1, BL-T2, BL-C1 and BL-C2) extends to bitline isolation circuitry (BL-ISO-A (LEFT), BL-ISO-A (RIGHT), BL-ISO-B (LEFT) and BL-ISO-B (RIGHT)) of the type described above with reference to FIG. 9. Notably, each of the bitline isolation circuitries (BL-ISO-A (LEFT), BL-ISO-A (RIGHT), BL-ISO-B (LEFT) and BL-ISO-B (RIGHT)) includes a series of transistors 20 in parallel, with the number of transistors being balanced with the number of memory cells on an attached bitline (e.g., line BL-T1 is shown to have 4 memory cells (MC-A(1-4)), and the isolation circuitry BL-ISO-A (LEFT) has four transistors 20).

The transistors 20 of FIG. 19 are similar to the transistors 20 of FIG. 17, and include channel regions 93 (only some of which are labeled) extending substantially vertically through the conductive material 90; with the channel regions 93 being between source/drain regions 101 and 103 (only some of which are labeled).

The memory cells (e.g., MC-A(1-4)) of FIG. 19 may be in any suitable configurations, including, for example 1T-1C configurations, 2T-1C configurations, 2T-2C configurations, 3T-1C configurations, etc. The memory cells (e.g., MC-A (1-4)) are shown to comprise capacitors C coupled with transistors T. The transistors may be along wordlines WL (only one of which is labeled) which comprise gates of the transistors.

Figure 20:
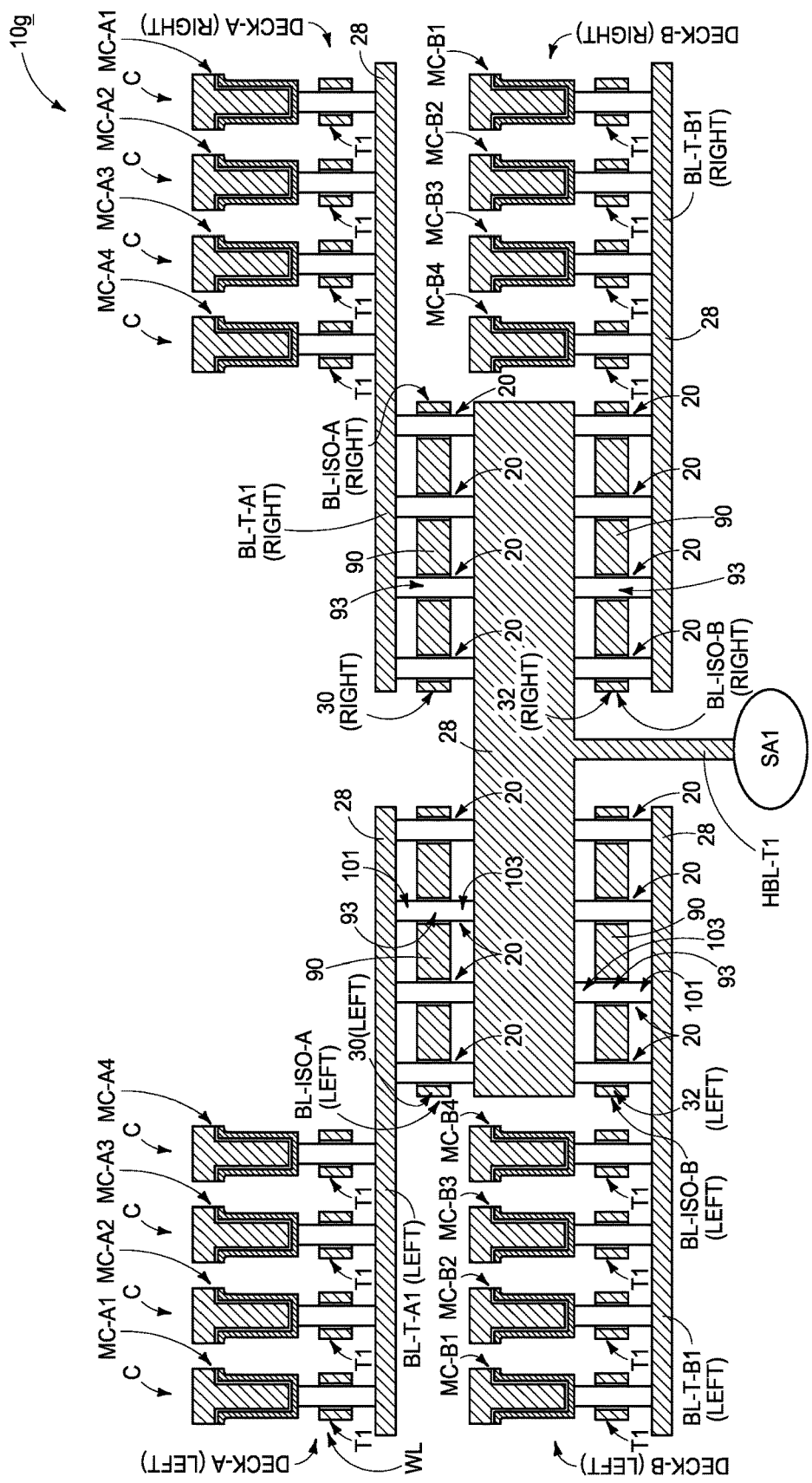

FIG. 20 shows another example integrated memory assembly 10g, with such assembly having stacked memory array decks (DECK-A and DECK-B). Each of the stacked decks has an array on the left of a hierarchical bitline path (HBL-T1) and an array on the right side of the hierarchical bitline path (HBL-T1); with the arrays on the left side being labeled as DECK-A (LEFT) and DECK-B (LEFT), and the arrays on the right side being labeled as DECK-A (RIGHT) and DECK-B (RIGHT). Each of the arrays includes multiple memory cells (e.g., MC-A(1-4) and MC-B(1-4)).

The comparative bitlines (BL-T-A1 (LEFT), BL-T-A1 (RIGHT), BL-T-B1 (LEFT) and BL-T-B1 (RIGHT)) extend to bitline isolation circuitry (BL-ISO-A (LEFT), BL-ISO-A (RIGHT), BL-ISO-B (LEFT) and BL-ISO-B (RIGHT)) of the type described above with reference to FIG. 9. Notably, each bitline isolation circuitry (BL-ISO-A (LEFT), BL-ISO-A (RIGHT), BL-ISO-B (LEFT) and BL-ISO-B (RIGHT)) includes a series of transistors 20 in parallel, with the number of transistors being balanced with the number of memory cells on an attached bitline (e.g., line BL-T-A1 (LEFT) is shown to have 4 memory cells (MC-A(1-4)), and the isolation circuitry BL-ISO-A (LEFT) has four transistors 20).

The transistors 20 of FIG. 20 are similar to the transistors 20 of FIG. 17, and include channel regions 93 (only some of which are labeled) extending substantially vertically through the conductive material 90 of the lines 30 and 32; with the channel regions 93 being between source/drain regions 101 and 103 (only some of which are labeled).

The memory cells (e.g., MC-A(1-4)) are shown to comprise capacitors C coupled with transistors T1. The transistors may be along wordlines WL (only one of which is labeled) which comprise gates of the transistors.

FIG. 20 may be considered to show a portion of an example embodiment of the FIG. 7 structure. The illustrated portion shows circuitry associated with transferring electrical signals between comparative bitlines (BL-T-A1 (LEFT), BL-T-A1 (RIGHT), BL-T-B1 (LEFT) and BL-T-B1 (RIGHT)) and the first sense amplifier (SA1). Additional structures may be provided to include other bitlines (e.g., the BL-C bitlines), other memory cells, other sense amplifiers, other wordlines, other memory array decks, etc. Additionally, controlled-voltage plates (e.g., PLATE-1 and PLATE-2 of FIG. 7) may be provided together with appropriate circuitry. The memory cells of FIG. 20 may be in any suitable configurations, including, for example 2T-1C configurations, 2T-2C configurations, 3T-1C configurations, etc.

Figure 21:
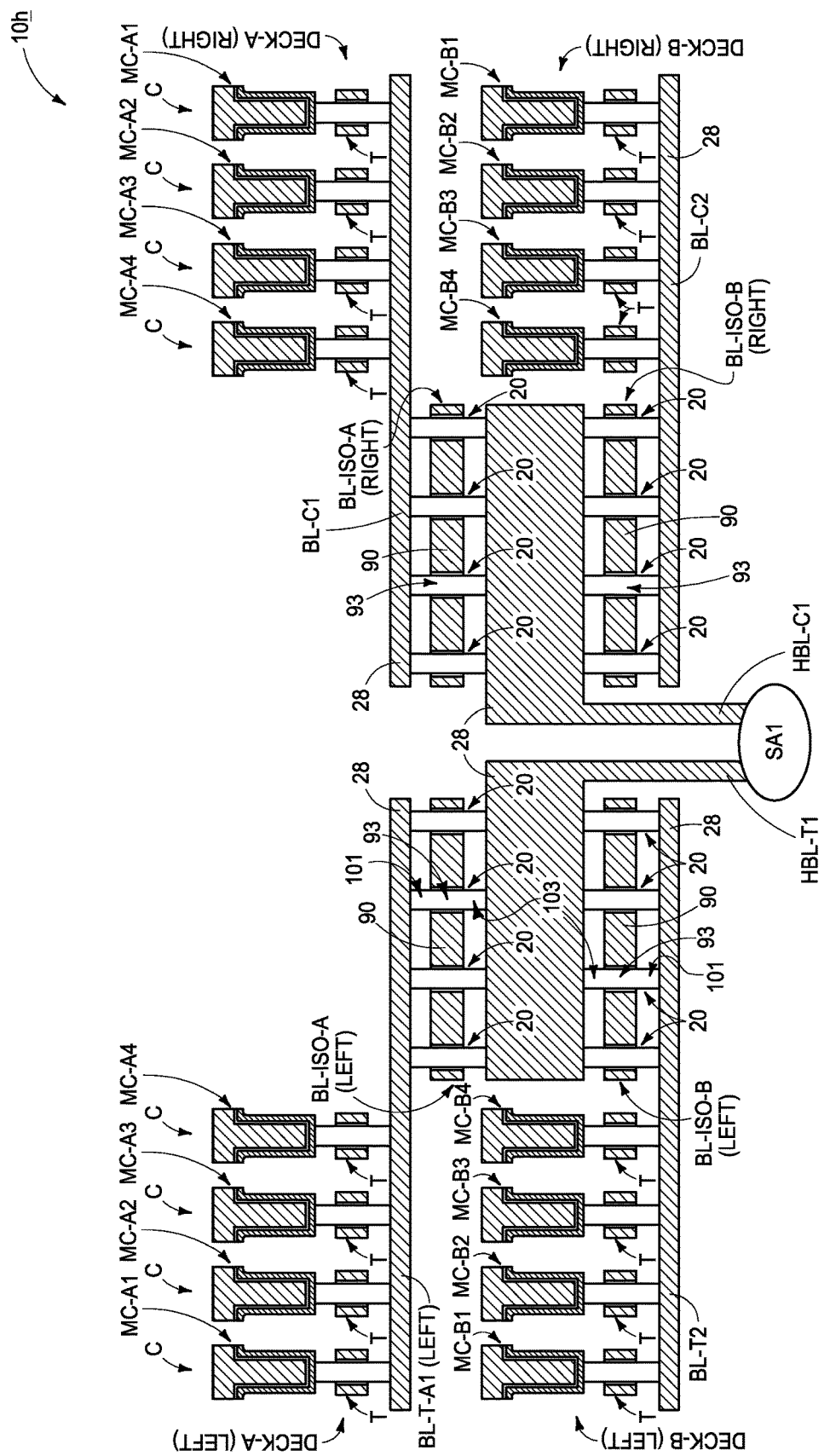

FIG. 21 shows another example integrated memory assembly 10h, with such assembly having stacked memory array decks (DECK-A and DECK-B) of a DRAM architecture with an open bitline arrangement. Each of the stacked decks has an array on the left with a comparative bitline (BL-T1, BL-T2) which is coupled with a hierarchical bitline path (HBL-T1), and has an array on the right with a comparative bitline (BL-C1, BL-C2) which is coupled with a hierarchical bitline path (HBL-C1). The arrays on the left side are labeled as DECK-A (LEFT) and DECK-B (LEFT), and the arrays on the right side are labeled as DECK-A (RIGHT) and DECK-B (RIGHT). Each of the arrays includes multiple memory cells (e.g., MC-A(1-4) and MC-B (1-4)).

The paths HBL-T1 and HBL-C1 extend to a sense amplifier SA1.

Each of the comparative bitlines (BL-T1, BL-T2, BL-C1 and BL-C2) extends to bitline isolation circuitry (BL-ISO-A (LEFT), BL-ISO-A (RIGHT), BL-ISO-B (LEFT) and BL-ISO-B (RIGHT)) of the type described above with reference to FIG. 9. Notably, each bitline isolation circuitry (BL-ISO-A (LEFT), BL-ISO-A (RIGHT), BL-ISO-B (LEFT) and BL-ISO-B (RIGHT)) includes a series of transistors 20 in parallel, with the number of transistors being balanced with the number of memory cells on an attached bitline (e.g., line BL-T1 is shown to have 4 memory cells (MC-A(1-4)), and the isolation circuitry BL-ISO-A (LEFT) has four transistors 20).

The transistors 20 of FIG. 21 are similar to the transistors 20 of FIG. 17, and include channel regions 93 (only some of which are labeled) extending substantially vertically through the conductive material 90; with the channel regions 93 being between source/drain regions 101 and 103 (only some of which are labeled).

The memory cells of FIG. 21 may be in any suitable configurations, including, for example 1T-1C configurations, 2T-1C configurations, 2T-2C configurations, 3T-1C configurations, etc. The memory cells (e.g., MC-A(1-4)) are shown to comprise capacitors C coupled with transistors T. The transistors may be along wordlines WL (only one of which is labeled) which comprise gates of the transistors.

Figure 22:
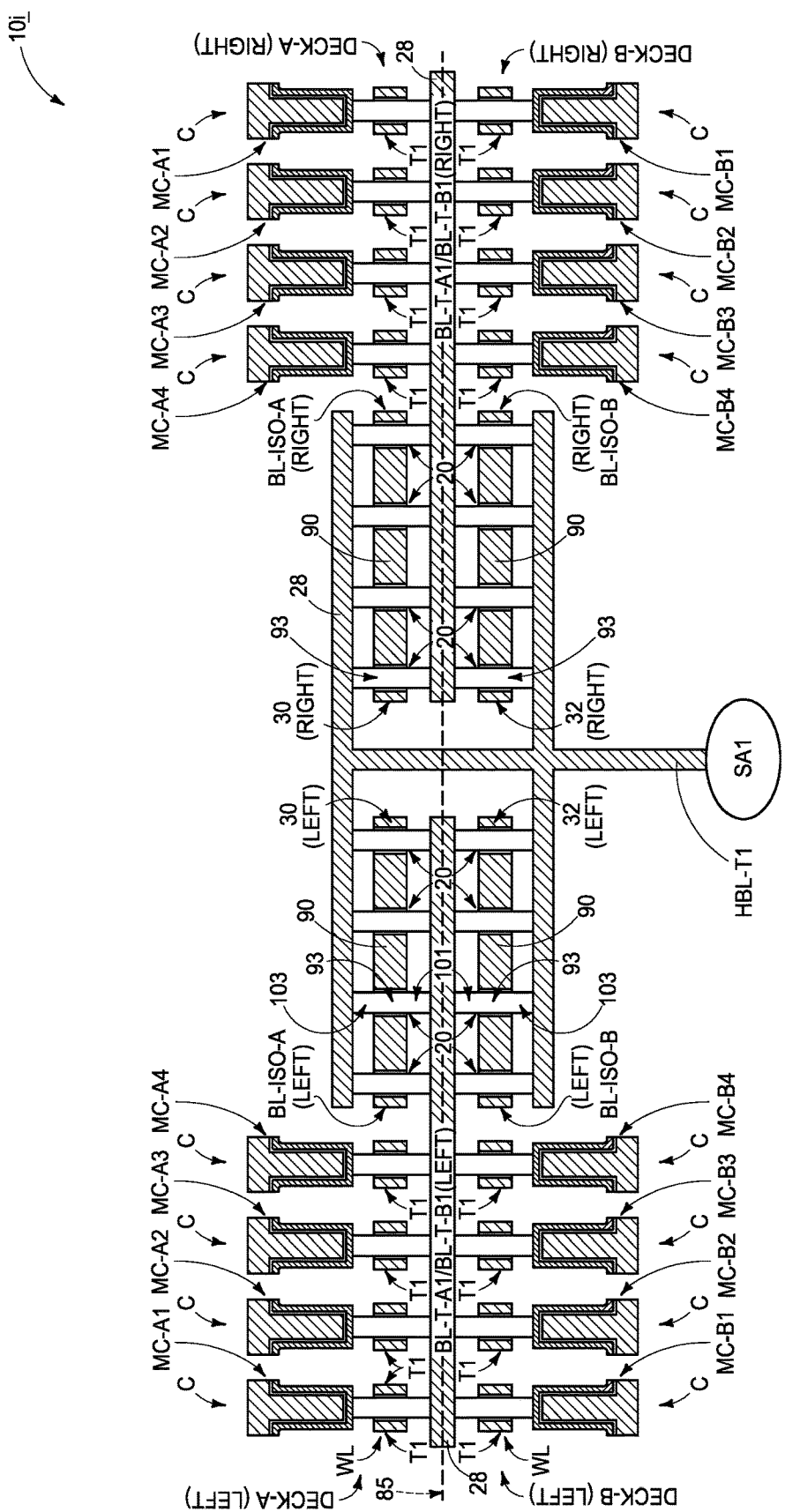

FIG. 22 shows another example integrated memory assembly 10i, with such assembly having stacked memory array decks (DECK-A and DECK-B) which are mirrored across a central plane 85 between them, and with the DECKs A and B sharing bitlines (BL-T-A1/BL-T-B1 (LEFT) and (RIGHT)). Each of the stacked decks has an array on the left of a hierarchical bitline path (HBL-T1) and an array on the right side of the hierarchical bitline path (HBL-T1); with the arrays on the left side being labeled as DECK-A (LEFT) and DECK-B (LEFT), and the arrays on the right side being labeled as DECK-A (RIGHT) and DECK-B (RIGHT). Each of the arrays includes multiple memory cells (e.g., MC-A (1-4) and MC-B(1-4)).

The comparative bitlines (BL-T-A1/BL-T-B1 (LEFT) and BL-T-A1/BL-T-B1 (RIGHT)) extend to bitline isolation circuitry (BL-ISO-A (LEFT), BL-ISO-A (RIGHT), BL-ISO-B (LEFT) and BL-ISO-B (RIGHT)) of the type described above with reference to FIG. 9. Notably, each bitline isolation circuitry (BL-ISO-A (LEFT), BL-ISO-A (RIGHT), BL-ISO-B (LEFT) and BL-ISO-B (RIGHT)) includes a series of transistors 20 in parallel, with the number of transistors being balanced with the number of memory cells on an attached bitline (e.g., line DECK-A (LEFT) is shown to have 4 memory cells (MC-A(1-4)), and the isolation circuitry BL-ISO-A (LEFT) has four transistors 20).

The transistors 20 of FIG. 22 are similar to the transistors 20 of FIG. 17, and include channel regions 93 (only some of which are labeled) extending substantially vertically through the conductive material 90 of the lines 30 and 32; with the channel regions 93 being between source/drain regions 101 and 103 (only some of which are labeled).

The memory cells (e.g., MC-A(1-4)) are shown to comprise capacitors C coupled with transistors T1. The transistors may be along wordlines WL (only one of which is labeled) which comprise gates of the transistors.

FIG. 22 may be considered to show a portion of an example embodiment of the FIG. 7 structure. The illustrated portion shows circuitry associated with conducting electrical signals between comparative bitlines (BL-T-A1/BL-T-B1 (LEFT), BL-T-A1/BL-T-B1 (RIGHT)) and the first sense amplifier (SA1). Additional structures may be provided to include other bitlines (e.g., the BL-C bitlines), other memory cells, other sense amplifiers, other wordlines, other memory decks, etc. Additionally, controlled-voltage plates (e.g., PLATE-1 and PLATE-2 of FIG. 7) may be provided together with appropriate circuitry. The memory cells of FIG. 22 may be in any suitable configurations, including, for example 2T-1C configurations, 2T-2C configurations, 3T-1C configurations, etc.

Figure 23:
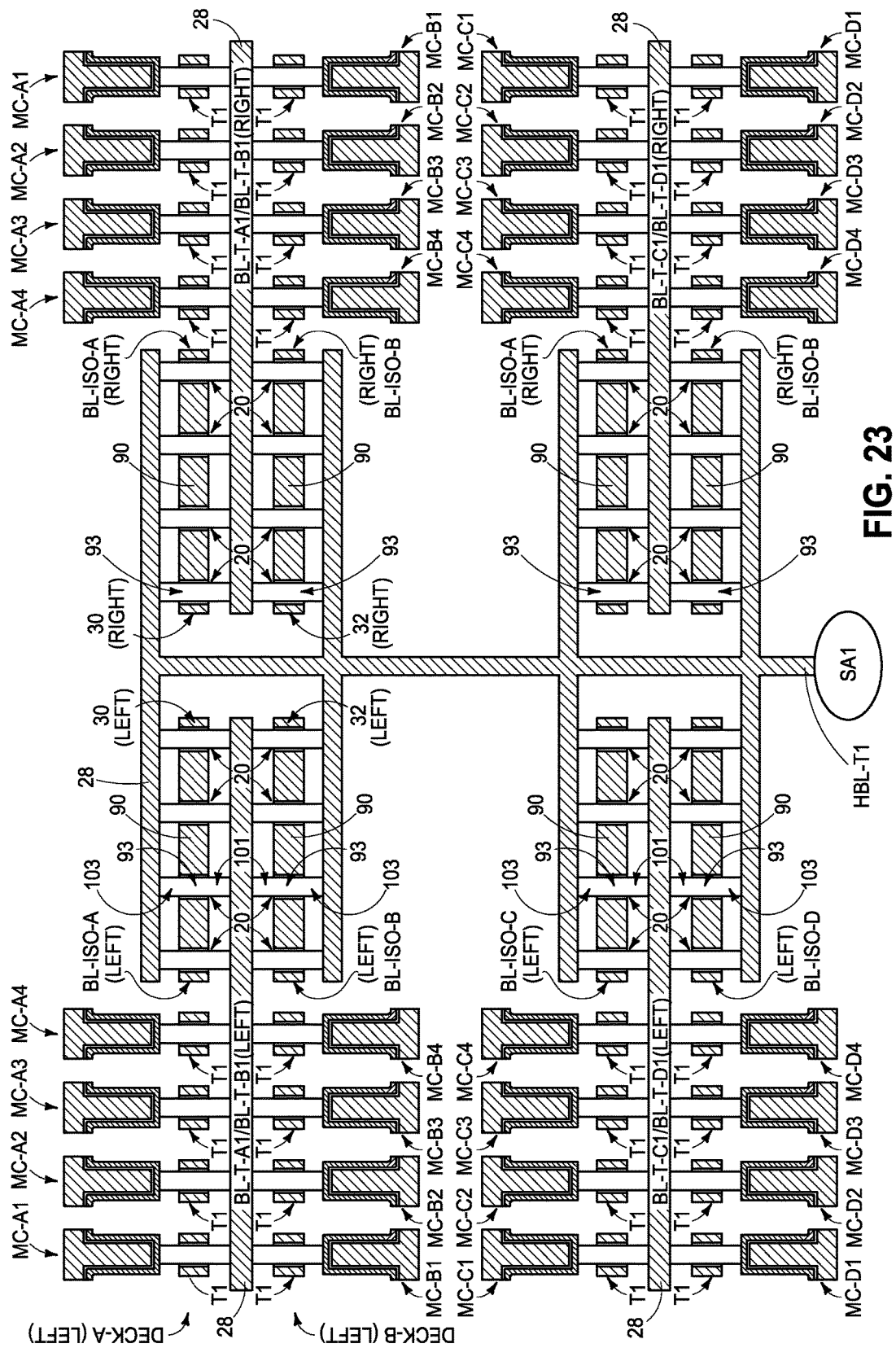

FIG. 23 shows another example integrated memory assembly 10j, with such assembly having stacked memory array decks (DECK-A, DECK-B, DECK-C and DECK-D), and with the DECKs A and B sharing bitlines (BL-T-A1/BL-T-B1 (LEFT) and (RIGHT)); and with the DECKs C and D sharing bitlines (BL-T-C1/BL-T-D1 (LEFT) and (RIGHT)). Each of the stacked decks has an array on the left of a hierarchical bitline path (HBL-T1) and an array on the right side of the hierarchical bitline path (HBL-T1); with the arrays on the left side being labeled as DECK-A (LEFT) and DECK-B (LEFT), and the arrays on the right side being labeled as DECK-A (RIGHT) and DECK-B (RIGHT). Each of the arrays includes multiple memory cells (e.g., MC-A (1-4) and MC-B(1-4)).

The comparative bitlines (BL-T-A1/BL-T-B1 (LEFT), BL-T-A1/BL-T-B1 (RIGHT), BL-T-C1/BL-T-D1 (LEFT), BL-T-C1/BL-T-D1 (RIGHT)) extend to bitline isolation circuitry (BL-ISO-A (LEFT), BL-ISO-A (RIGHT), BL-ISO-B (LEFT), BL-ISO-B (RIGHT), BL-ISO-C (LEFT), BL-ISO-C (RIGHT), BL-ISO-D (LEFT) and BL-ISO-D (RIGHT)) of the type described above with reference to FIG. 9. Notably, each bitline isolation circuitry (BL-ISO-A (LEFT), BL-ISO-A (RIGHT), BL-ISO-B (LEFT), BL-ISO-B (RIGHT), BL-ISO-C (LEFT), BL-ISO-C (RIGHT), BL-ISO-D (LEFT) and BL-ISO-D (RIGHT)) includes a series of transistors 20 in parallel, with the number of transistors being balanced with the number of memory cells on an attached bitline (e.g., line DECK-A (LEFT) is shown to have 4 memory cells (MC-A(1-4)), and the isolation circuitry BL-ISO-A (LEFT) has four transistors 20).

The transistors 20 of FIG. 23 are similar to the transistors 20 of FIG. 17, and include channel regions 93 (only some of which are labeled) extending substantially vertically through the conductive material 90; with the channel regions 93 being between source/drain regions 101 and 103 (only some of which are labeled).

The memory cells (e.g., MC-A(1-4)) are shown to comprise capacitors C coupled with transistors T1. The transistors may be along wordlines WL (only one of which is labeled) which comprise gates of the transistors.

FIG. 23 may be considered to show a portion of an example embodiment of the FIG. 7 structure. The illustrated portion shows circuitry associated with conducting electrical signals between comparative bitlines (BL-T-A1/BL-T-B1 (LEFT), BL-T-A1/BL-T-B1 (RIGHT), BL-T-C1/BL-T-D1 (LEFT), BL-T-C1/BL-T-D1 (RIGHT)) and the first sense amplifier (SA1). Additional structures may be provided to include other bitlines (e.g., the BL-C bitlines), other memory cells, other sense amplifiers, other wordlines, other memory decks, etc. Additionally, controlled-voltage plates (e.g., PLATE-1 and PLATE-2 of FIG. 7) may be provided together with appropriate circuitry. The memory cells of FIG. 23 may be in any suitable configurations, including, for example 2T-1C configurations, 2T-2C configurations, 3T-1C configurations, etc.

Figure 24:
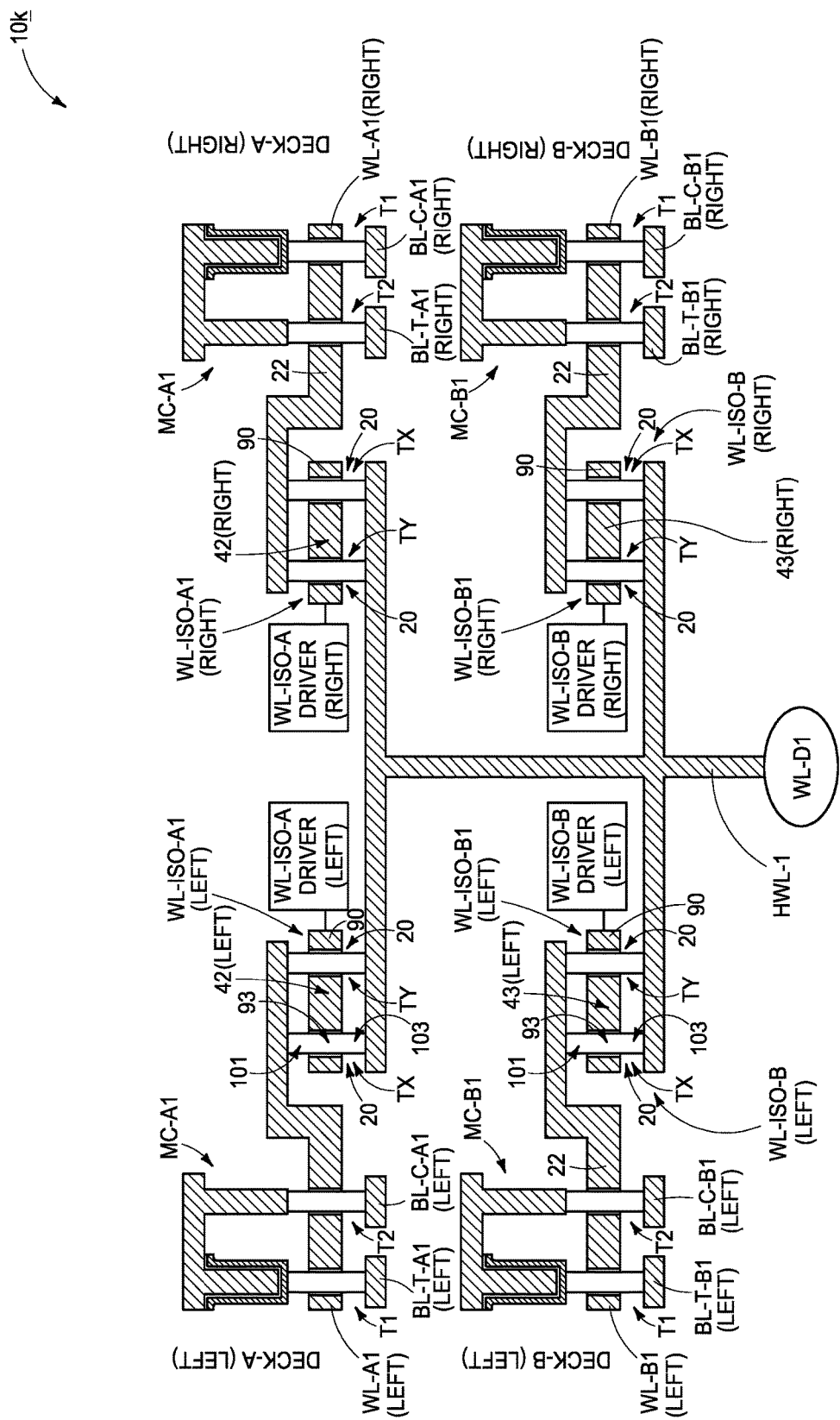

FIG. 24 shows another example integrated memory assembly 10k, with such assembly having stacked memory array decks (DECK-A and DECK-B). Each of the stacked decks has an array on the left of a hierarchical wordline path (HWL-1) and an array on the right side of the hierarchical wordline path (HWL-1); with the arrays on the left side being labeled as DECK-A (LEFT) and DECK-B (LEFT), and the arrays on the right side being labeled as DECK-A (RIGHT) and DECK-B (RIGHT). Each of the arrays includes memory cells (e.g., MC-A1 and MC-B1).

Wordlines (WL-A1 (LEFT), WL-A1 (RIGHT), WL-B1 (LEFT) and WL-B1 (RIGHT)) extend across the arrays to wordline isolation circuitry (WL-ISO-A (LEFT), WL-ISO-A (RIGHT), WL-ISO-B (LEFT) and WL-ISO-B (RIGHT)) of the type described above with reference to FIG. 10. The wordline isolation circuitries (WL-ISO-A (LEFT), WL-ISO-A (RIGHT), WL-ISO-B (LEFT) and WL-ISO-B (RIGHT)) comprise paired transistors 20; with one of the transistors being labeled TX and the other being labeled TY. Such transistors may be PMOS devices and/or NMOS devices. In some embodiments, it may be advantageous for one of the paired transistors TX and TY to be a PMOS device while the other is an NMOS device.

In some applications, each of the wordline isolation circuitries (e.g., WL-ISO-A (LEFT)) may be considered to include a multiplexer (mux).

The transistors 20 of FIG. 24 are similar to the transistors 20 of FIG. 17, and include channel regions 93 (only some of which are labeled) extending substantially vertically through the conductive material 90 of lines 42 and 43; with the channel regions 93 being between source/drain regions 101 and 103 (only some of which are labeled). In the illustrated embodiment, the lines 42 and 43 extend substantially horizontally (as do the memory arrays of DECKs A and B), and the channel regions 93 extend substantially vertically through the conductive material 90 of the lines 42 and 43.

In some embodiments, the conductive lines 42 and 43 of wordline isolation circuitries WL-ISO-A (LEFT and RIGHT) and WL-ISO-B (LEFT and RIGHT) may be referred to as first and second conductive lines, respectively; and the conductive material 90 within the first conductive line 42 (LEFT and RIGHT) may be referred to as first conductive material, while the conductive material 90 within the second conductive line 43 (LEFT and RIGHT) is referred to as second conductive material. The first conductive material within the first conductive line 42 (LEFT and RIGHT) is coupled with first isolation drivers (WL-ISO-A DRIVER LEFT and WL-ISO-A DRIVER RIGHT), and the second conductive material within the second conductive line 43 (LEFT and RIGHT) is coupled with a second isolation drivers (WL-ISO-B DRIVER LEFT and WL-ISO-B DRIVER RIGHT).

FIG. 24 may be considered to show a portion of an example embodiment of the FIG. 7 structure. The illustrated portion shows circuitry associated with conducting electrical signals between comparative wordlines (WL-A1 (LEFT), WL-A1 (RIGHT), WL-B1 (LEFT) and WL-B1 (RIGHT)) and the wordline driver (WL-D1). Additional structures may be provided to include other wordlines, other memory cells, other bitlines, sense amplifiers, other memory decks, etc.

Additionally, controlled-voltage plates (e.g., PLATE-1 and PLATE-2 of FIG. 7) may be provided together with appropriate circuitry. The memory cells of FIG. 24 may be in any suitable configurations, including, for example 2T-1C configurations, 2T-2C configurations, 3T-1C configurations, etc.

The structures and architectures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated memory assembly comprising a first memory array deck over a second memory array deck. A first series of conductive lines extends across the first memory array deck, and a second series of conductive lines extends across the second memory array deck. A first conductive line of the first series and a first conductive line of the second series are coupled with a first component through a first conductive path. A second conductive line of the first series and a second conductive line of the second series are coupled with a second component through a second conductive path. The first and second conductive lines of the first series extend through first isolation circuitry to the first and second conductive paths, respectively. The first isolation circuitry includes a first transistor which gatedly connects the first conductive line of the first series to the first conductive path, and includes a second transistor which gatedly connects the second conductive line of the first series to the second conductive path. The gates of the first and second transistors are coupled with a first isolation driver. The first and second conductive lines of the second series extend through second isolation circuitry to the first and second conductive paths, respectively. The second isolation circuitry includes a third transistor which gatedly connects the first conductive line of the second series to the first conductive path, and includes a fourth transistor which gatedly connects the second conductive line of the second series to the second conductive path. The gates of the third and fourth transistors are coupled with a second isolation driver.

Some embodiments include an integrated memory assembly comprising a first memory array deck A over a second memory array deck B. A first series of bitlines is along the first memory array deck A, and includes paired comparative bitlines BL-T-A1 and BL-C-A1, and paired comparative bitlines BL-T-A2 and BL-C-A2. A second series of bitlines is along the second memory array deck B, and including paired comparative bitlines BL-T-B1 and BL-C-B1, and paired comparative bitlines BL-T-B2 and BL-C-B2. The paired comparative bitlines BL-T-A1 and BL-C-A1 are coupled with a first sense amplifier through a first BL-T conductive path and a first BL-C conductive path, respectively. The paired comparative bitlines BL-T-A2 and BL-C-A2 are coupled with a second sense amplifier through a second BL-T conductive path and a second BL-C conductive path, respectively. The paired comparative bitlines BL-T-B1 and BL-C-B1 are coupled with the first sense amplifier through the first BL-T conductive path and the first BL-C conductive path, respectively. The paired comparative bitlines BL-T-B2 and BL-C-B2 are coupled with the second sense amplifier through the second BL-T conductive path and the second BL-C conductive path, respectively. The bitlines BL-T-A1, BL-C-A1, BL-T-A2 and BL-C-A2 extend through first isolation circuitry to the first BL-T conductive path, the first BL-C conductive path, the second BL-T conductive path and the second BL-C conductive path, respectively. The first isolation circuitry includes a first transistor which gatedly connects BL-T-A1 to the first BL-T conductive path, a second transistor which gatedly connects BL-C-A1 to the first BL-C conductive path, a third transistor which gatedly connects BL-T-A2 to the second BL-T conductive path, and a fourth transistor which gatedly connects BL-C-A2 to the second BL-C conductive path. The gates of the first, second, third and fourth second transistors are coupled with a first bitline isolation driver. The bitlines BL-T-B1, BL-C-B1, BL-T-B2 and BL-C-B2 extend through second isolation circuitry to the first BL-T conductive path, the first BL-C conductive path, the second BL-T conductive path and the second BL-C conductive path, respectively. The second isolation circuitry includes a fifth transistor which gatedly connects BL-T-B1 to the first BL-T conductive path, a sixth transistor which gatedly connects BL-C-B1 to the first BL-C conductive path, a seventh transistor which gatedly connects BL-T-B2 to the second BL-T conductive path, and an eighth transistor which gatedly connects BL-C-B2 to the second BL-C conductive path. The gates of the fifth, sixth, seventh and eighth transistors are coupled with a second bitline isolation driver.

Some embodiments include an integrated memory assembly comprising a first memory array deck A over a second memory array deck B. A first series of wordlines is along the first memory array deck A, and includes wordlines WL-A1 and WL-A2. A second series of wordlines is along the second memory array deck B, and includes wordlines WL-B1 and WL-B2. The wordlines Wl-A1 and WL-B1 are coupled with a first wordline driver through a first conductive path. The wordlines WL-A2 and WL-B2 are coupled with a second wordline driver through a second conductive path. The wordlines WL-A1 and WL-A2 extend through first isolation circuitry to the first and second conductive paths, respectively. The first isolation circuitry includes a first transistor which gatedly connects WL-A1 to the first conductive path, and includes a second transistor which gatedly connects WL-A2 to the second conductive path. The gates of the first and second transistors are coupled with a first wordline isolation driver. The wordlines WL-B1 and WL-B2 extend through second isolation circuitry to the first and second conductive paths, respectively. The second isolation circuitry includes a third transistor which gatedly connects WL-B1 to the first conductive path, and includes a fourth transistor which gatedly connects of WL-B2 to the second conductive path. The gates of the third and fourth transistors are coupled with a second wordline isolation driver.

Some embodiments include an integrated memory assembly comprising a first memory array deck A over a second memory array deck B. A first set of conductive lines extends across the first memory array deck A. The first set of conductive lines comprises a first series of wordlines and a first series of bitlines. The wordlines of the first series include a wordline WL-A1 and a wordline WL-A2. The bitlines of the first series include paired comparative bitlines BL-T-A1 and BL-C-A1, and paired comparative bitlines BL-T-A2 and BL-C-A2. A second set of conductive lines extends across the second memory array deck B. The second set of conductive lines comprises a second series of wordlines and a second series of bitlines. The wordlines of the second series include a wordline WL-B1 and a wordline WL-B2. The bitlines of the second series including paired comparative bitlines BL-T-B1 and BL-C-B1, and paired comparative bitlines BL-T-B2 and BL-C-B2. The wordlines Wl-A1 and WL-B1 are coupled with a first wordline driver through a first wordline conductive path. The wordlines WL-A2 and WL-B2 are coupled with a second wordline driver through a second wordline conductive path. The wordlines WL-A1 and WL-A2 extend through first wordline isolation circuitry to the first and second wordline conductive paths, respectively. The first wordline isolation circuitry includes a first transistor which gatedly connects WL-A1 to the first wordline conductive path, and includes a second transistor which gatedly connects WL-A2 to the second wordline conductive path. The gates of the first and second transistors are coupled with a first wordline isolation driver. The wordlines WL-B1 and WL-B2 extend through second wordline isolation circuitry to the first and second wordline conductive paths, respectively. The second wordline isolation circuitry includes a third transistor which gatedly connects WL-B1 to the first wordline conductive path, and includes a fourth transistor which gatedly connects WL-B2 to the second wordline conductive path. The gates of the third and fourth transistors are coupled with a second wordline isolation driver. The paired comparative bitlines BL-T-A1 and BL-C-A1 are coupled with a first sense amplifier through a first BL-T conductive path and a first BL-C conductive path, respectively; and the paired comparative bitlines BL-T-A2 and BL-C-A2 are coupled with a second sense amplifier through a second BL-T conductive path and a second BL-C conductive path, respectively. The paired comparative bitlines BL-T-B1 and BL-C-B1 are coupled with the first sense amplifier through the first BL-T conductive path and the first BL-C conductive path, respectively; and the paired comparative bitlines BL-T-B2 and BL-C-B2 are coupled with the second sense amplifier through the second BL-T conductive path and the second BL-C conductive path, respectively. The bitlines BL-T-A1, BL-C-A1, BL-T-A2 and BL-C-A2 extend through first bitline isolation circuitry to the first BL-T conductive path, the first BL-C conductive path, the second BL-T conductive path and the second BL-C conductive path, respectively. The first bitline isolation circuitry includes a fifth transistor which gatedly connects BL-T-A1 to the first BL-T conductive path, a sixth transistor which gatedly connects BL-C-A1 to the first BL-C conductive path, a seventh transistor which gatedly connects BL-T-A2 to the second BL-T conductive path, and an eighth transistor which gatedly connects BL-C-A2 to the second BL-C conductive path. The gates of the fifth, sixth, seventh and eighth transistors are coupled with a first bitline isolation driver. The bitlines BL-T-B1, BL-C-B1, BL-T-B2 and BL-C-B2 extend through second bitline isolation circuitry to the first BL-T conductive path, the first BL-C conductive path, the second BL-T conductive path and the second BL-C conductive path, respectively. The second bitline isolation circuitry includes a ninth transistor which gatedly connects BL-T-B1 to the first BL-T conductive path, a tenth transistor which gatedly connects BL-C-B1 to the first BL-C conductive path, an eleventh transistor which gatedly connects BL-T-B2 to the second BL-T conductive path, and a twelfth transistor which gatedly connects BL-C-B2 to the second BL-C conductive path. The gates of the ninth, tenth, eleventh and twelfth transistors are coupled with a second bitline isolation driver.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated memory assembly, comprising:
a first memory array deck over a second memory array deck;
a first series of conductive lines extending across the first memory array deck, and a second series of conductive lines extending across the second memory array deck;
a first conductive line of the first series and a first conductive line of the second series being coupled with a first component through a first conductive path;
a second conductive line of the first series and a second conductive line of the second series being coupled with a second component through a second conductive path;
the first and second conductive lines of the first series extending through first isolation circuitry to the first and second conductive paths, respectively; the first isolation circuitry including a first transistor which gatedly connects the first conductive line of the first series to the first conductive path, and including a second transistor which gatedly connects the second conductive line of the first series to the second conductive path; the gates of the first and second transistors being coupled with a first isolation driver; and the first and second conductive lines of the second series extending through second isolation circuitry to the first and second conductive paths, respectively; the second isolation circuitry including a third transistor which gatedly connects the first conductive line of the second series to the first conductive path, and including a fourth transistor which gatedly connects the second conductive line of the second series to the second conductive path; the gates of the third and fourth transistors being coupled with a second isolation driver.

2. The integrated memory assembly of claim 1 wherein the conductive lines of the first and second series are wordlines.

3. The integrated memory assembly of claim 1 wherein the conductive lines of the first and second series are bitlines.

4. The integrated memory assembly of claim 1 wherein:
the gates of the first and second transistors are coupled with a first conductive material extending to the first isolation driver;
the gates of the second and third transistors are coupled with a second conductive material extending to the second isolation driver;
the first and second transistors have channel regions extending through the first conductive material; and
the third and fourth transistors have channel regions extending through the second conductive material.

5. The integrated memory assembly of claim 1 wherein the conductive lines of the first and second series are bitlines; and further comprising:
a third series of conductive lines extending across the first memory array deck, and a fourth series of conductive lines extending across the second memory array deck; the conductive lines of the third and fourth series being wordlines;
a first conductive line of the third series and a first conductive line of the fourth series being coupled with a first wordline driver through a third conductive path;
a second conductive line of the third series and a second conductive line of the fourth series being coupled with a second wordline driver through a fourth conductive path;
the first and second conductive lines of the third series extending through third isolation circuitry to the third and fourth conductive paths, respectively; the third isolation circuitry including a fifth transistor which gatedly connects the first conductive line of the third series to the third conductive path, and including a sixth transistor which gatedly connects the second conductive line of the third series to the fourth conductive path; the gates of the fifth and sixth transistors being coupled with a third isolation driver; and
the first and second conductive lines of the fourth series extending through fourth isolation circuitry to the third and fourth conductive paths, respectively; the fourth isolation circuitry including a seventh transistor which gatedly connects the first conductive line of the fourth series to the third conductive path, and including an eighth transistor which gatedly connects the second conductive line of the fourth series to the fourth conductive path; the gates of the seventh and eighth transistors being coupled with a fourth isolation driver.

6. The integrated memory assembly of claim 5 wherein:
the first and second memory array decks extend horizontally:
the gates of the first and second transistors are coupled with a first conductive material extending to the first isolation driver;
the gates of the second and third transistors are coupled with a second conductive material extending to the second isolation driver;
the gates of the third and fourth transistors are coupled with a third conductive material extending to the third isolation driver;
the gates of the fifth and sixth transistors are coupled with a fourth conductive material extending to the fourth isolation driver;
the first and second transistors have channel regions extending substantially vertically through the first conductive material;
the third and fourth transistors have channel regions extending substantially vertically through the second conductive material;
the fifth and sixth transistors have channel regions extending substantially vertically through the third conductive material; and
the seventh and eighth transistors have channel regions extending substantially vertically through the fourth conductive material.

7. The integrated memory assembly of claim 1 wherein the first and second memory array decks include 1T-1C memory cells.

8. The integrated memory assembly of claim 1 wherein the first and second memory array decks include 2T-2C memory cells.

9. The integrated memory assembly of claim 1 wherein the first and second memory array decks include 3T-1C memory cells.

10. The integrated memory assembly of claim 1 wherein the first and second memory array decks include 2T-1C memory cells.

11. An integrated memory assembly, comprising:
a first memory array deck A over a second memory array deck B;
a first series of bitlines along the first memory array deck A, and including paired comparative bitlines BL-T-A1 and BL-C-A1, and paired comparative bitlines BL-T-A2 and BL-C-A2;
a second series of bitlines along the second memory array deck B, and including paired comparative bitlines BL-T-B1 and BL-C-B1, and paired comparative bitlines BL-T-B2 and BL-C-B2;
the paired comparative bitlines BL-T-A1 and BL-C-A1 being coupled with a first sense amplifier through a first BL-T conductive path and a first BL-C conductive path, respectively;
the paired comparative bitlines BL-T-A2 and BL-C-A2 being coupled with a second sense amplifier through a second BL-T conductive path and a second BL-C conductive path, respectively;
the paired comparative bitlines BL-T-B1 and BL-C-B1 being coupled with the first sense amplifier through the first BL-T conductive path and the first BL-C conductive path, respectively;
the paired comparative bitlines BL-T-B2 and BL-C-B2 being coupled with the second sense amplifier through the second BL-T conductive path and the second BL-C conductive path, respectively;
the bitlines BL-T-A1, BL-C-A1, BL-T-A2 and BL-C-A2 extending through first isolation circuitry to the first BL-T conductive path, the first BL-C conductive path, the second BL-T conductive path and the second BL-C conductive path, respectively; the first isolation circuitry including a first transistor which gatedly connects BL-T-A1 to the first BL-T conductive path, a second transistor which gatedly connects BL-C-A1 to the first BL-C conductive path, a third transistor which gatedly connects BL-T-A2 to the second BL-T conductive path, and a fourth transistor which gatedly connects BL-C-A2 to the second BL-C conductive path; the gates of the first, second, third and fourth second transistors being coupled with a first bitline isolation driver; and the bitlines BL-T-B1, BL-C-B1, BL-T-B2 and BL-C-B2 extending through second isolation circuitry to the first BL-T conductive path, the first BL-C conductive path, the second BL-T conductive path and the second BL-C conductive path, respectively; the second isolation circuitry including a fifth transistor which gatedly connects BL-T-B1 to the first BL-T conductive path, a sixth transistor which gatedly connects BL-C-B1 to the first BL-C conductive path, a seventh transistor which gatedly connects BL-T-B2 to the second BL-T conductive path, and an eighth transistor which gatedly connects BL-C-B2 to the second BL-C conductive path; the gates of the fifth, sixth, seventh and eighth transistors being coupled with a second bitline isolation driver.

12. The integrated memory assembly of claim 11 wherein:
the first and second memory array decks A and B extend horizontally:
the gates of the first, second, third and fourth transistors are coupled with a first conductive line extending to the first bitline isolation driver;
the gates of the fifth, sixth, seventh and eighth transistors are coupled with a second conductive line extending to the second bitline isolation driver;
the first, second, third and fourth transistors have channel regions extending substantially vertically through the first conductive line; and
the fifth, sixth, seventh and eighth transistors have channel regions extending substantially vertically through the second conductive line.

13. The integrated memory assembly of claim 11 wherein the first series of paired comparative bitlines extend across a first memory array of the first memory array deck A, wherein the first isolation circuitry is proximate the first memory array, wherein the second series of paired comparative bitlines extend across a second memory array of the second memory array deck B, and wherein the second isolation circuitry is proximate the second memory array; and comprising:
at least one controlled-voltage plate proximate the first and second memory arrays;
the bitlines BL-T-A1, BL-C-A1, BL-T-A2 and BL-C-A2 extending through third isolation circuitry to the controlled-voltage plate; the third isolation circuitry including a ninth transistor which gatedly connects BL-T-A1 to the controlled-voltage plate, a tenth transistor which gatedly connects BL-C-A1 to the controlled-voltage plate, an eleventh transistor which gatedly connects BL-T-A2 to the controlled-voltage plate, and a twelfth transistor which gatedly connects BL-C-A2 to the controlled-voltage plate; the gates of the ninth, tenth, eleventh and twelfth transistors being coupled with a third bitline isolation driver; and
the bitlines BL-T-B1, BL-C-B1, BL-T-B2 and BL-C-B2 extending through fourth isolation circuitry to the controlled-voltage plate; the fourth isolation circuitry including a thirteenth transistor which gatedly connects BL-T-B1 to the controlled-voltage plate, a fourteenth transistor which gatedly connects BL-C-B1 to the controlled-voltage plate, a fifteenth transistor which gatedly connects BL-T-B2 to the controlled-voltage plate, and a sixteenth transistor which gatedly connects BL-C-B2 to the controlled-voltage plate; the gates of the thirteenth, fourteenth, fifteenth and sixteenth transistors being coupled with a fourth bitline isolation driver.

14. The integrated memory assembly of claim 11 wherein the first and second sense amplifiers are below the second memory array deck.

15. An integrated memory assembly, comprising:
a first memory array deck A over a second memory array deck B;
a first series of wordlines along the first memory array deck A, and including wordlines WL-A1 and WL-A2;
a second series of wordlines along the second memory array deck B, and including wordlines WL-B1 and WL-B2;
the wordlines Wl-A1 and WL-B1 being coupled with a first wordline driver through a first conductive path;
the wordlines WL-A2 and WL-B2 being coupled with a second wordline driver through a second conductive path;
the wordlines WL-A1 and WL-A2 extending through first isolation circuitry to the first and second conductive paths, respectively; the first isolation circuitry including a first transistor which gatedly connects WL-A1 to the first conductive path, and including a second transistor which gatedly connects WL-A2 to the second conductive path; the gates of the first and second transistors being coupled with a first wordline isolation driver; and
the wordlines WL-B1 and WL-B2 extending through second isolation circuitry to the first and second conductive paths, respectively; the second isolation circuitry including a third transistor which gatedly connects WL-B1 to the first conductive path, and including a fourth transistor which gatedly connects of WL-B2 to the second conductive path; the gates of the third and fourth transistors being coupled with a second wordline isolation driver.

16. The integrated memory assembly of claim 15 wherein:
the first and second memory array decks A and B extend horizontally:
the gates of the first and second transistors are coupled with a first conductive line extending to the first wordline isolation driver;
the gates of the second and third transistors are coupled with a second conductive line extending to the second wordline isolation driver;
the first and second transistors have channel regions extending substantially vertically through the first conductive line; and
the third and fourth transistors have channel regions extending substantially vertically through the second conductive line.

17. The integrated memory assembly of claim 15 wherein the first and second wordline drivers are below the second memory array deck.

18. The integrated memory assembly of claim 15 wherein the first series of wordlines extend across a first memory array of the first memory array deck A, wherein the first isolation circuitry is proximate the first memory array, wherein the second series of wordlines extend across a second memory array of the second memory array deck B, and wherein the second isolation circuitry is proximate the second memory array; and comprising:
- at least one controlled-voltage plate proximate the first and second memory arrays;
- the wordlines WL-A1 and WL-A2 extending through third isolation circuitry to the controlled-voltage plate; the third isolation circuitry including a fifth transistor which gatedly connects WL-A1 to the controlled-voltage plate, and a sixth transistor which gatedly connects WL-A2 to the controlled-voltage plate; the gates of the fifth and sixth transistors being coupled with a third wordline isolation driver; and
- the wordlines WL-B1 and WL-B2 extending through fourth isolation circuitry to the controlled-voltage plate; the fourth isolation circuitry including a seventh transistor which gatedly connects WL-B1 to the controlled-voltage plate, and an eighth transistor which gatedly connects WL-B2 to the controlled-voltage plate; the gates of the seventh and eighth transistors being coupled with a fourth wordline isolation driver.

19. An integrated memory assembly, comprising:
a first memory array deck A over a second memory array deck B;
a first set of conductive lines extending across the first memory array deck A; the first set of conductive lines comprising a first series of wordlines and a first series of bitlines; the wordlines of the first series including a wordline WL-A1 and a wordline WL-A2; the bitlines of the first series including paired comparative bitlines BL-T-A1 and BL-C-A1, and paired comparative bitlines BL-T-A2 and BL-C-A2;
a second set of conductive lines extending across the second memory array deck B; the second set of conductive lines comprising a second series of wordlines and a second series of bitlines; the wordlines of the second series including a wordline WL-B1 and a wordline WL-B2; the bitlines of the second series including paired comparative bitlines BL-T-B1 and BL-C-B1, and paired comparative bitlines BL-T-B2 and BL-C-B2;
the wordlines Wl-A1 and WL-B1 being coupled with a first wordline driver through a first wordline conductive path;
the wordlines WL-A2 and WL-B2 being coupled with a second wordline driver through a second wordline conductive path;
the wordlines WL-A1 and WL-A2 extending through first wordline isolation circuitry to the first and second wordline conductive paths, respectively; the first wordline isolation circuitry including a first transistor which gatedly connects WL-A1 to the first wordline conductive path, and including a second transistor which gatedly connects WL-A2 to the second wordline conductive path; the gates of the first and second transistors being coupled with a first wordline isolation driver;
the wordlines WL-B1 and WL-B2 extending through second wordline isolation circuitry to the first and second wordline conductive paths, respectively; the second wordline isolation circuitry including a third transistor which gatedly connects WL-B1 to the first wordline conductive path, and including a fourth transistor which gatedly connects WL-B2 to the second wordline conductive path; the gates of the third and fourth transistors being coupled with a second wordline isolation driver;
the paired comparative bitlines BL-T-A1 and BL-C-A1 being coupled with a first sense amplifier through a first BL-T conductive path and a first BL-C conductive path, respectively;
the paired comparative bitlines BL-T-A2 and BL-C-A2 being coupled with a second sense amplifier through a second BL-T conductive path and a second BL-C conductive path, respectively;
the paired comparative bitlines BL-T-B1 and BL-C-B1 being coupled with the first sense amplifier through the first BL-T conductive path and the first BL-C conductive path, respectively;
the paired comparative bitlines BL-T-B2 and BL-C-B2 being coupled with the second sense amplifier through the second BL-T conductive path and the second BL-C conductive path, respectively;
the bitlines BL-T-A1, BL-C-A1, BL-T-A2 and BL-C-A2 extending through first bitline isolation circuitry to the first BL-T conductive path, the first BL-C conductive path, the second BL-T conductive path and the second BL-C conductive path, respectively; the first bitline isolation circuitry including a fifth transistor which gatedly connects BL-T-A1 to the first BL-T conductive path, a sixth transistor which gatedly connects BL-C-A1 to the first BL-C conductive path, a seventh transistor which gatedly connects BL-T-A2 to the second BL-T conductive path, and an eighth transistor which gatedly connects BL-C-A2 to the second BL-C conductive path; the gates of the fifth, sixth, seventh and eighth transistors being coupled with a first bitline isolation driver; and
the bitlines BL-T-B1, BL-C-B1, BL-T-B2 and BL-C-B2 extending through second bitline isolation circuitry to the first BL-T conductive path, the first BL-C conductive path, the second BL-T conductive path and the second BL-C conductive path, respectively; the second bitline isolation circuitry including a ninth transistor which gatedly connects BL-T-B1 to the first BL-T conductive path, a tenth transistor which gatedly connects BL-C-B1 to the first BL-C conductive path, an eleventh transistor which gatedly connects BL-T-B2 to the second BL-T conductive path, and a twelfth transistor which gatedly connects BL-C-B2 to the second BL-C conductive path; the gates of the ninth, tenth, eleventh and twelfth transistors being coupled with a second bitline isolation driver.

20. The integrated memory assembly of claim 19 wherein the first and second wordline drivers are below the second memory array deck.

21. The integrated memory assembly of claim 19 wherein the first and second sense amplifiers are below the second memory array deck.

22. The integrated memory assembly of claim 19 wherein the first and second wordline drivers are below the second memory array deck, and wherein the first and second sense amplifiers are below the second memory array deck.

* * * * *